US012604714B2

(12) United States Patent
Terajima et al.

(10) Patent No.: US 12,604,714 B2
(45) Date of Patent: Apr. 14, 2026

(54) LIFT-OFF METHOD

(71) Applicant: DISCO CORPORATION, Tokyo (JP)

(72) Inventors: Masato Terajima, Tokyo (JP); Junya Mimura, Tokyo (JP); Tasuku Koyanagi, Tokyo (JP); Hiroshi Morikazu, Tokyo (JP); Yuki Suto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 356 days.

(21) Appl. No.: 18/359,138

(22) Filed: Jul. 26, 2023

(65) Prior Publication Data

US 2024/0038591 A1 Feb. 1, 2024

(30) Foreign Application Priority Data

Aug. 1, 2022 (JP) ................................. 2022-122947

(51) Int. Cl.
*H01L 21/66* (2006.01)
*H10P 52/00* (2026.01)
(Continued)

(52) U.S. Cl.
CPC ............ *H10P 95/112* (2026.01); *H10P 52/00* (2026.01); *H10P 72/74* (2026.01); *H10P 72/78* (2026.01); *H10P 72/7442* (2026.01)

(58) Field of Classification Search
CPC ............... H01L 21/7813; H01L 21/304; H01L 21/6835; H01L 21/6838;
(Continued)

(56) References Cited

U.S. PATENT DOCUMENTS 5,273,553 A * 12/1993 Hoshi .................... H01L 25/50
257/E21.705
6,071,795 A * 6/2000 Cheung ............... H01L 21/2007
438/483
(Continued)

FOREIGN PATENT DOCUMENTS

JP 2004072052 A 3/2004

OTHER PUBLICATIONS

Office Action issued in counterpart German patent application No. 10 2023 207 001.4, dated Feb. 19, 2026.

*Primary Examiner* — Vu A Vu
(74) *Attorney, Agent, or Firm* — Greer Burns & Crain Ltd.

(57) ABSTRACT

A lift-off method includes joining a transfer substrate to a face side of an optical device layer of an optical device wafer with a joining member interposed therebetween, thereby making up a composite substrate, applying a pulsed laser beam having a wavelength transmittable through the epitaxy substrate and absorbable by a buffer layer, from a reverse side of the epitaxy substrate of the optical device wafer, thereby breaking the buffer layer, and an optical device layer transferring step of peeling off the epitaxy substrate from the optical device layer and transferring the optical device layer to the transfer substrate. The optical device layer transferring step includes the step of applying a bending moment to an area of the composite substrate that includes an outer peripheral portion thereof while holding an area of the composite substrate that includes a central portion thereof.

10 Claims, 23 Drawing Sheets

(51) Int. Cl.
    *H10P 72/70*         (2026.01)
    *H10P 72/78*         (2026.01)
    *H10P 95/00*         (2026.01)

(58) Field of Classification Search
    CPC ........ H01L 2221/68386; H10H 20/018; H10H
                   20/01; B23K 26/0624; B23K 26/36
    USPC ......................................................... 438/455
    See application file for complete search history.

(56) References Cited

U.S. PATENT DOCUMENTS

| | | | | |
|---|---|---|---|---|
| 7,943,491 | B2 * | 5/2011 | Nuzzo ................ | H10F 77/1696 |
| | | | | 438/735 |
| 9,059,013 | B2 * | 6/2015 | Dimitrakopoulos ........................ | |
| | | | | H10D 62/814 |
| 10,096,740 | B1 * | 10/2018 | Chen ...................... | H10H 20/83 |
| 10,177,123 | B2 * | 1/2019 | Gardner ............. | H01L 25/0753 |
| 10,297,479 | B2 * | 5/2019 | Dang ................. | H01L 21/6836 |
| 10,355,166 | B2 * | 7/2019 | Jeung .................. | H10H 20/018 |
| 10,910,511 | B2 * | 2/2021 | Mori ........................ | C30B 19/02 |
| 11,107,685 | B2 * | 8/2021 | Nakamura ............. | H01L 21/02 |
| 11,315,901 | B2 * | 4/2022 | Zinner ................... | H01L 24/83 |
| 11,515,444 | B2 * | 11/2022 | Sang ................... | H01L 25/0753 |
| 11,804,397 | B2 * | 10/2023 | Marinov ............. | B23K 26/354 |
| 2014/0076500 | A1 | 3/2014 | Honda et al. | |
| 2015/0221819 | A1 | 8/2015 | Morikazu | |
| 2020/0243708 | A1 | 7/2020 | Yanagawa et al. | |

* cited by examiner

START

101 — TRANSFER SUBSTRATE JOINING STEP

102 — BUFFER LAYER BREAKING STEP

103 {

1031 — PLACING STEP

1032 — ENTIRE SURFACE SUCTION STEP

1033 — OUTER PERIPHERAL PORTION RELEASING STEP

}

104 — FINISHED ?

No

Yes

END

NEGATIVE PRESSURE GENERATING SOURCE

NEGATIVE PRESSURE
GENERATING SOURCE

LIFT-OFF METHOD

BACKGROUND OF THE INVENTION

Field of the Invention

The present invention relates to a lift-off method of transferring an optical device layer from an optical device wafer to a transfer substrate.

Description of the Related Art

In recent years, attention has been drawn to a fabrication method called "lift-off" as a technology for increasing the luminance of optical devices (see, for example, JP 2004-72052A).

According to the fabrication method disclosed in JP 2004-72052A, an optical device layer including an n-type semiconductor layer and a p-type semiconductor layer that are placed on a surface of an epitaxy substrate such as a sapphire substrate or silicon carbide (SiC) substrate with a buffer layer interposed therebetween is joined to a transfer substrate by a joint member made of metal such as silver-tin alloy (AgSn) or an organic material such as resin, and a laser beam having a wavelength that is transmittable through the epitaxy substrate and absorbable by the buffer layer is applied to the assembly from the reverse side of the epitaxy substrate, thereby breaking the buffer layer, so that the optical device layer is peeled off from the epitaxy substrate and transferred to the transfer substrate.

SUMMARY OF THE INVENTION

However, according to the fabrication method disclosed in JP 2004-72052A, when the laser beam is applied from the reverse side of the epitaxy substrate while having its focused spot positioned at the buffer layer, the laser beam may not sufficiently break the buffer layer, possibly failing to peel off the epitaxy substrate smoothly.

Another problem is that in case the epitaxy substrate has a plurality of miniscule surface irregularities on its surface for improving the quality of optical devices, the miniscule surface irregularities on the surface of the epitaxy substrate make it difficult to peel off the epitaxy substrate even if the buffer layer is broken by the applied laser beam.

It is therefore an object of the present invention to provide a lift-off method that is capable of smoothly peeling off an epitaxy substrate even if a buffer layer is not sufficiently broken.

In accordance with an aspect of the present invention, there is provided a lift-off method of transferring an optical device layer to a transfer substrate from an optical device wafer where the optical device layer has been disposed on a face side of an epitaxy substrate with a buffer layer interposed therebetween, including a transfer substrate joining step of joining the transfer substrate to a face side of the optical device layer of the optical device wafer with a joining member interposed therebetween, thereby making up a composite substrate, a buffer layer breaking step of applying a pulsed laser beam having a wavelength transmittable through the epitaxy substrate and absorbable by the buffer layer, from a reverse side of the epitaxy substrate of the optical device wafer of the composite substrate, thereby breaking the buffer layer, and after the buffer layer breaking step, an optical device layer transferring step of peeling off the epitaxy substrate from the optical device layer and transferring the optical device layer to the transfer substrate, wherein the optical device layer transferring step includes a step of transferring the optical device layer to the transfer substrate by applying a bending moment to an area of the composite substrate that includes an outer peripheral portion thereof while holding an area of the composite substrate that includes a central portion thereof.

Preferably, the optical device layer transferring step includes a step of applying the bending moment in a direction opposite a direction in which the composite substrate is warped.

Preferably, the optical device layer transferring step includes a step of repeatedly applying the bending moment to the area of the composite substrate that includes the outer peripheral portion thereof.

Preferably, the optical device layer transferring step includes the step of transferring the optical device layer to the transfer substrate by repeating an entire surface suction step of bringing the transfer substrate that is warped in a projecting manner into facing relation to the holding table and attracting an entire surface of the composite substrate under suction to the holding table, thereby applying the bending moment in the direction opposite the direction in which the composite substrate is warped, to an area of the transfer substrate that includes its outer peripheral portion, and after the entire surface suction step, an outer peripheral portion releasing step of releasing the area of the composite substrate that includes the outer peripheral portion thereof from being held under suction while continuously holding the area of the composite substrate that includes the central portion thereof under suction.

Preferably, the optical device layer transferring step includes the step of transferring the optical device layer to the transfer substrate by repeating a depressing step of, while the composite substrate is being placed on the holding table with the transfer substrate that is warped in a projecting manner facing the holding table, depressing the area of the composite substrate including the outer peripheral portion thereof from the epitaxy substrate side of the composite substrate, thereby applying the bending moment in the direction opposite the direction in which the composite substrate is warped, to the area of the transfer substrate including the outer peripheral portion thereof, and a depression canceling step of canceling the depression of the area of the composite substrate including the outer peripheral portion thereof that has been depressed in the depressing step.

Preferably, the optical device layer transferring step further includes a fluid ejecting step of ejecting a fluid to the buffer layer that is disposed at the boundary between the epitaxy substrate and the transfer substrate of the composite substrate.

Preferably, the optical device layer transferring step further includes an epitaxy substrate holding step of holding the epitaxy substrate side of the composite substrate under suction.

The present invention offers an advantage in that even if the buffer layer has not sufficiently been broken, the epitaxy substrate can smoothly be peeled off from the optical device layer.

The above and other objects, features and advantages of the present invention and the manner of realizing them will become more apparent, and the invention itself will best be understood from a study of the following description and appended claims with reference to the attached drawings showing some preferred embodiments of the invention.

4

Figure 21:
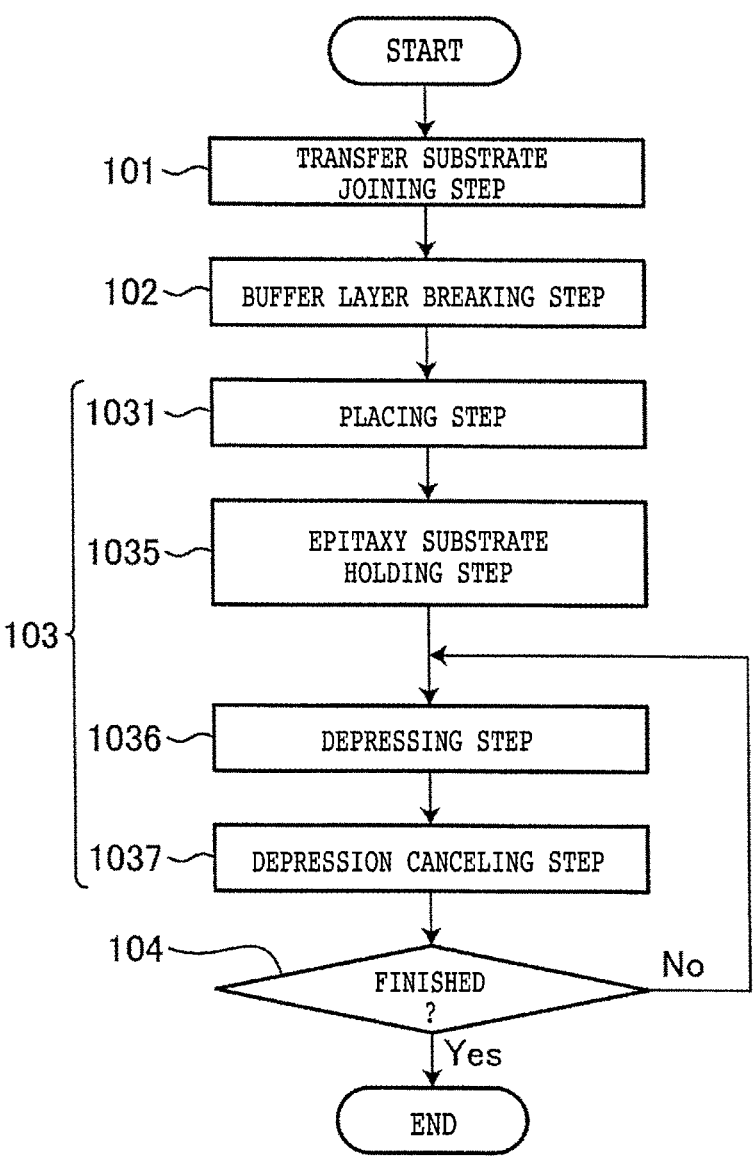
Figure 22:
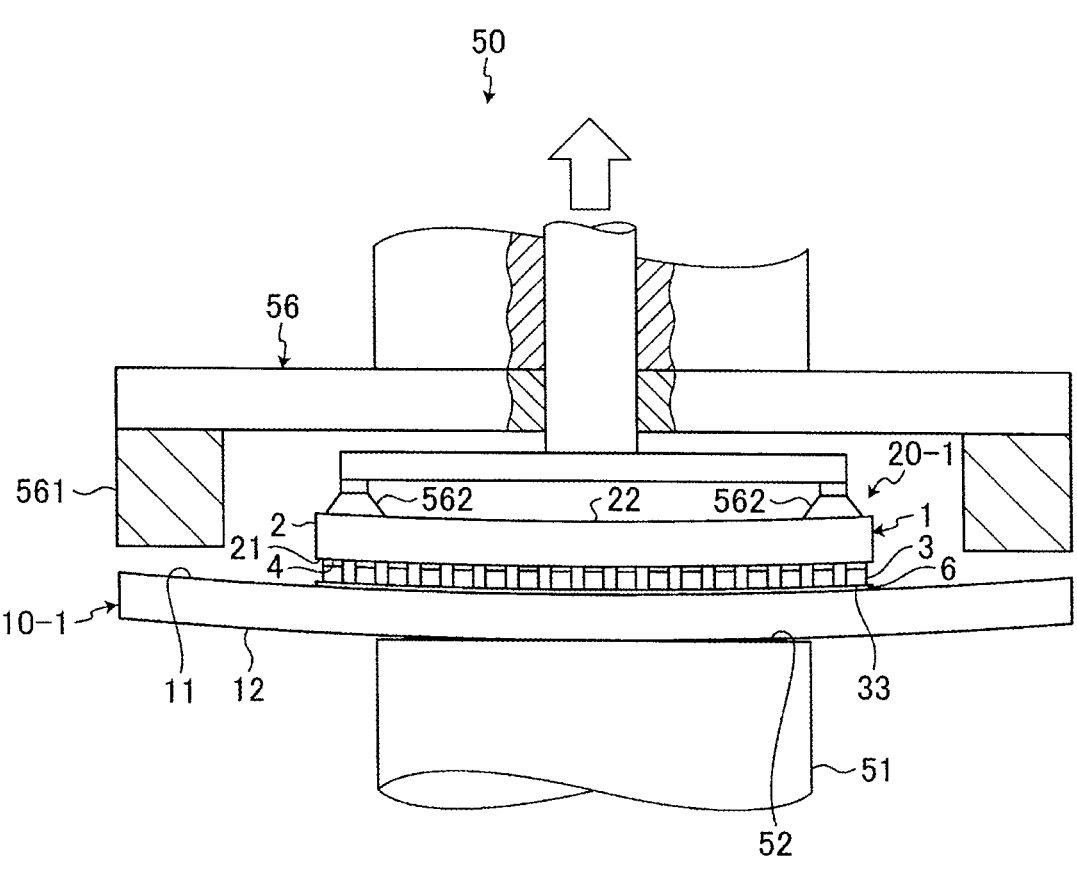
Figure 23:
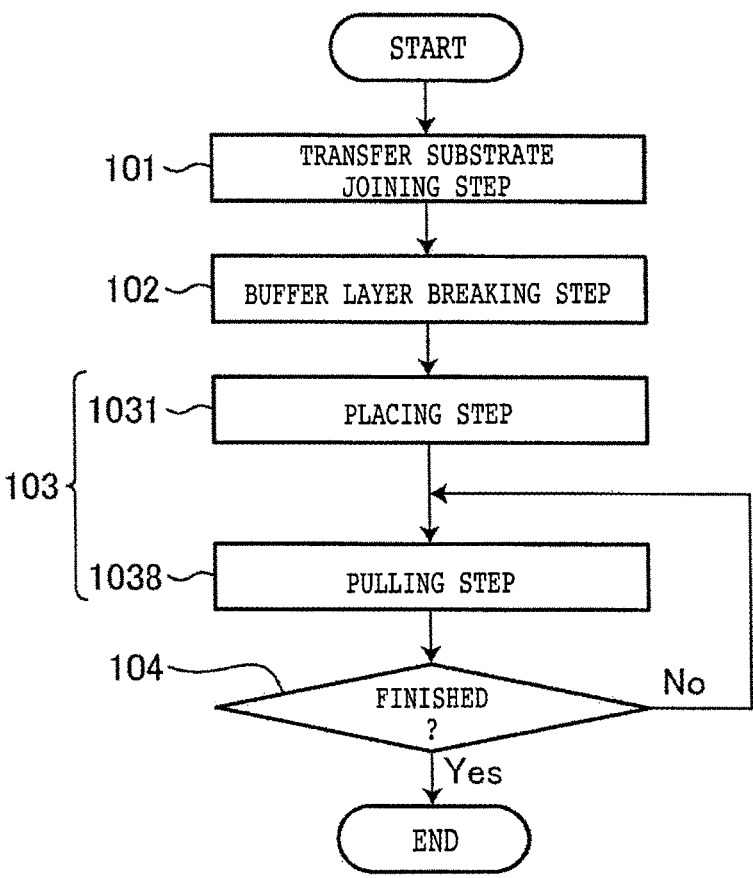
Figure 24:
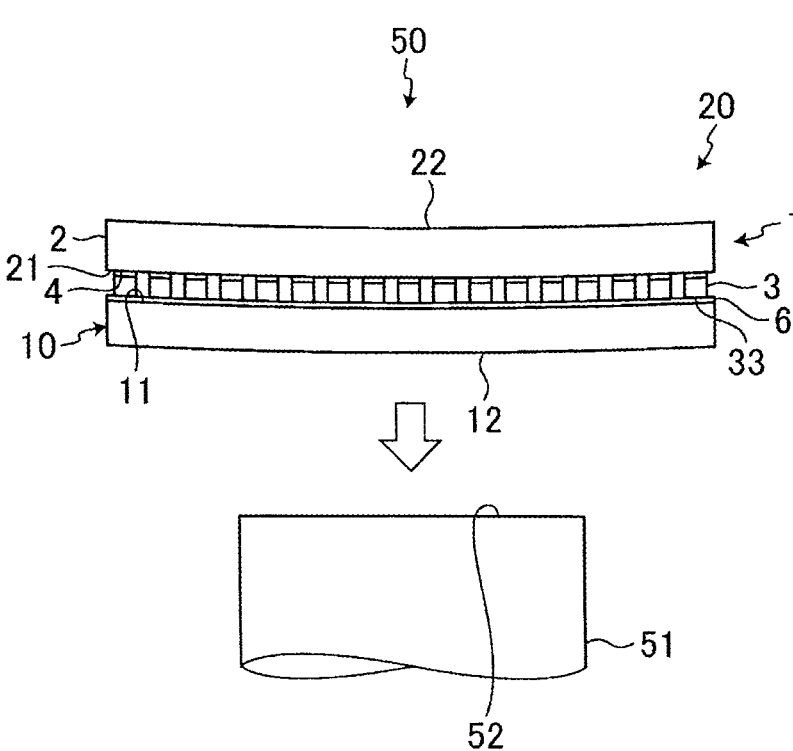
Figure 25:
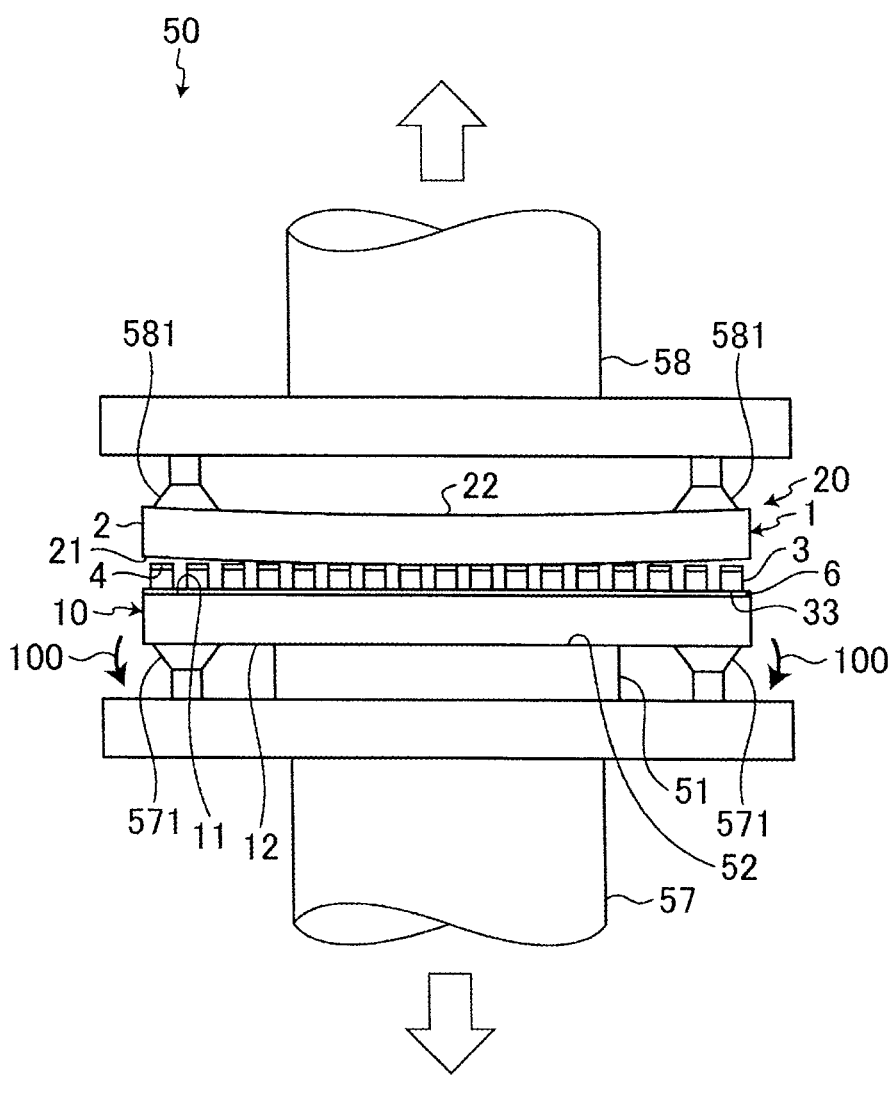
Figure 26:
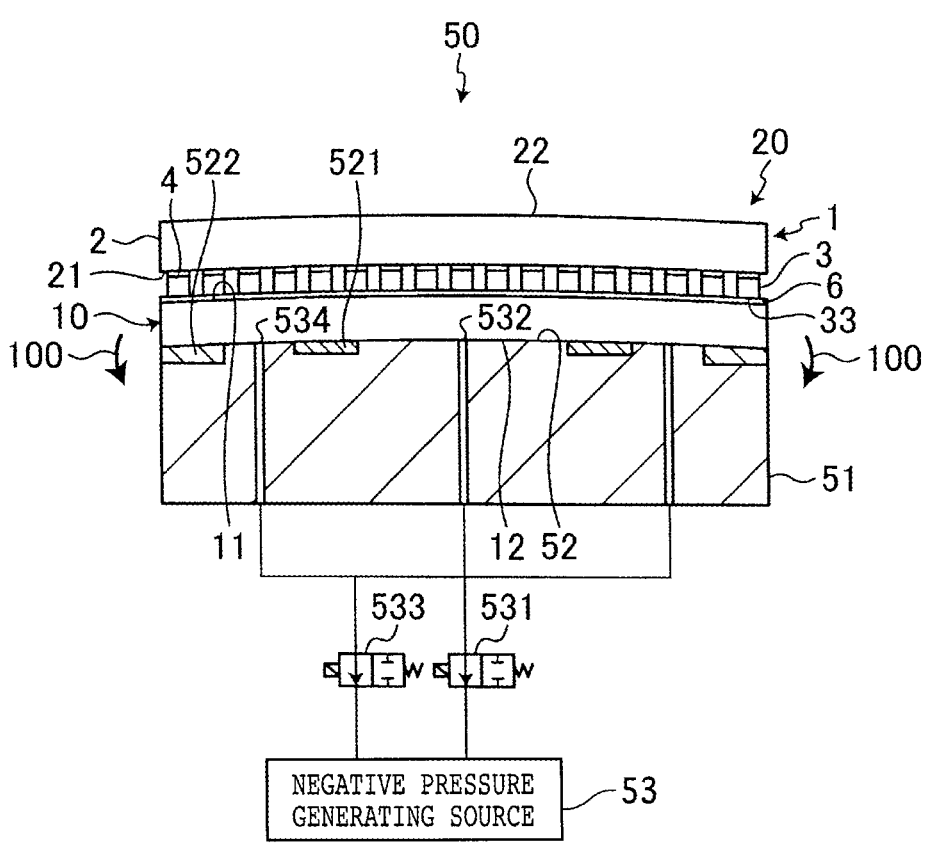

FIG. 21 is a flowchart of the sequence of a lift-off method according to a second modification of the second embodiment;

FIG. 22 is a side elevational view, partly in cross section, schematically illustrating an epitaxy substrate holding step of the lift-off method illustrated in FIG. 21;

FIG. 23 is a flowchart of the sequence of a lift-off method according to a third embodiment of the present invention;

FIG. 24 is a side elevational view schematically illustrating an optical device layer transferring step of the lift-off method illustrated in FIG. 23;

FIG. 25 is a side elevational view schematically illustrating a pulling step of the optical device layer transferring step of the lift-off method illustrated in FIG. 23; and FIG. 26 is a side elevational view, partly in cross section, schematically illustrating the optical device layer transferring step of the lift-off methods according to a modification of the first embodiment, the second embodiment, and the third embodiment.

DETAILED DESCRIPTION OF THE PREFERRED EMBODIMENTS

Preferred embodiments of the present invention will be described in detail below with reference to the accompanying drawings. The present invention is not limited to the details of the embodiments described below. The components described below cover those which could easily be anticipated by those skilled in the art and those which are essentially identical to those described below. Furthermore, the arrangements described below can be combined in appropriate manners. Various omissions, replacements, or changes of the arrangements may be made without departing from the scope of the present invention. In the description below, those components that are identical to each other are denoted by identical reference signs.

First Embodiment

Figure 1:
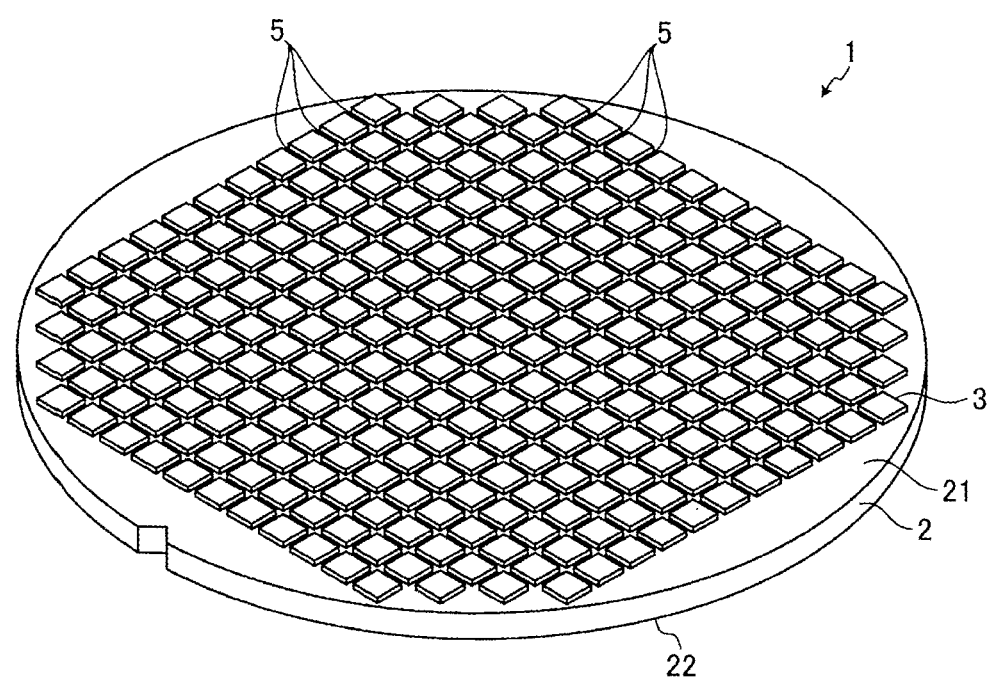
FIG. 1 is a perspective view schematically illustrating a structural example of an optical device wafer to be processed by a lift-off method according to a first embodiment of the present invention.
Figure 2:
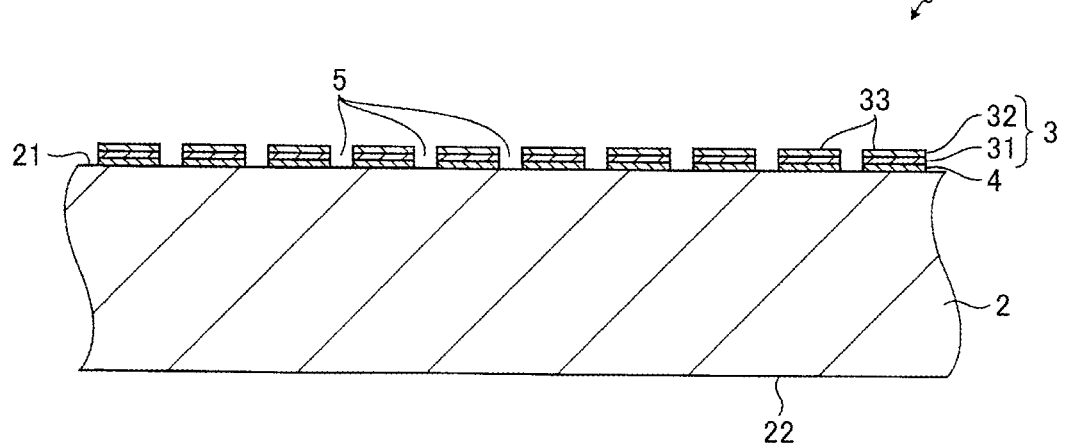
FIG. 2 is a fragmentary cross-sectional view schematically illustrating a portion of the optical device wafer illustrated in FIG. 1.
Figure 3:
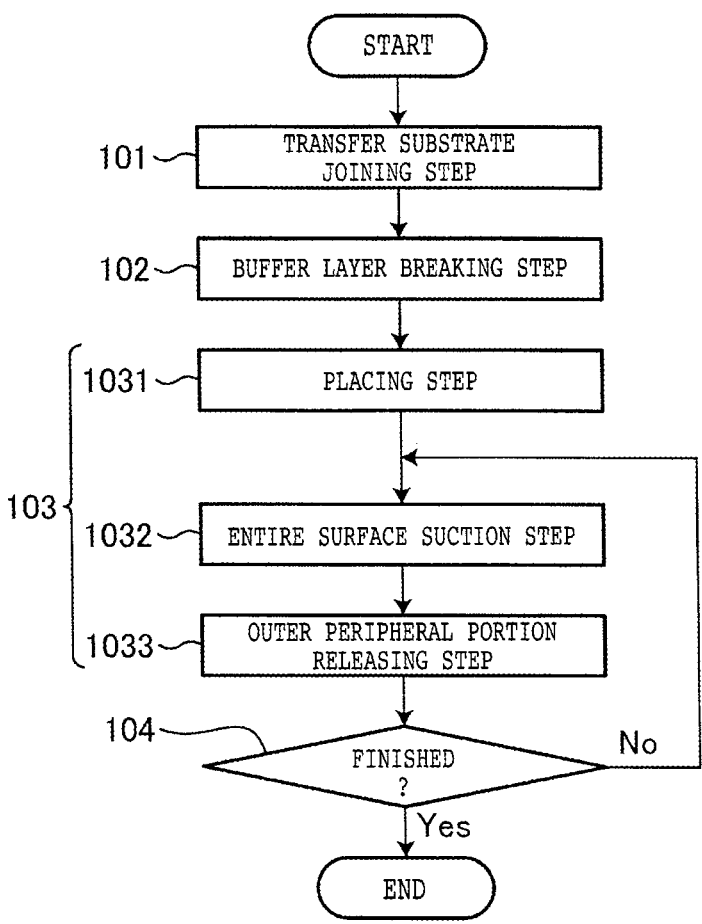
FIG. 3 is a flowchart of the sequence of the lift-off method according to the first embodiment.

A lift-off method according to a first embodiment of the present invention will be described below with reference to the drawings. FIG. 1 schematically illustrates, in perspective, a structural example of an optical device wafer to be processed by the lift-off method according to the first embodiment. FIG. 2 schematically illustrates, in fragmentary cross section, in a portion of the optical device wafer illustrated in FIG. 1. FIG. 3 is a flowchart of the sequence of the lift-off method according to the first embodiment. The lift-off method according to the first embodiment is a method of processing the optical device wafer, denoted by 1, illustrated in FIGS. 1 and 2.

(Optical Device Wafer)

As illustrated in FIG. 1, the optical device wafer 1 to be processed by the lift-off method according to the first embodiment includes an optical device layer 3 formed on a face side 21 of an epitaxy substrate 2 shaped as a circular plate of sapphire by an epitaxial growth process. A buffer layer 4 illustrated in FIG. 2 that is made of gallium nitride (GaN) and has a thickness of 1 μm, for example, is interposed between the face side 21 of the epitaxy substrate 2 and the optical device layer 3. Therefore, the optical device layer 3 is placed on the face side 21 of the epitaxy substrate 2 with the buffer layer 4 interposed therebetween, as illustrated in FIG. 2.

As illustrated in FIG. 2, the optical device layer 3 includes a p-type gallium nitride semiconductor layer 31 and an n-type gallium nitride semiconductor layer 32 that are successively disposed on the buffer layer 4. According to the first embodiment, the optical device layer 3 has a thickness of 10 μm, for example. According to the first embodiment, the optical device layer 3 is divided into a plurality of optical devices demarcated by a grid of streets 5, as illustrated in FIGS. 1 and 2.

When the optical device layer 3 is grown on the face side 21 of the epitaxy substrate 2 by the epitaxial growth process, the epitaxy substrate 2 is warped such that the face side 21 thereof has its central portion made projection due to the different lattice constants of the sapphire crystal of the epitaxy substrate 2 and the GaN crystal of the optical device layer 3. Specifically, the epitaxy substrate 2 is warped to the extent that the distance between the central portion of the face side 21 and an outer edge of the face side 21 in thicknesswise directions of the epitaxy substrate 2 is in the range from approximately 30 to 50 μm.

(Lift-off Method)

Figure 4:
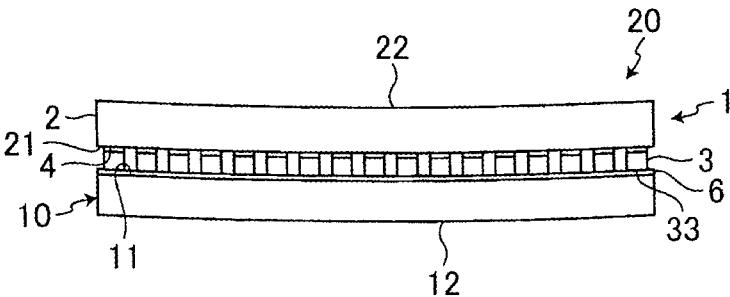
FIG. 4 is a side elevational view schematically illustrating a composite substrate formed in a transfer substrate joining step of the lift-off method illustrated in FIG. 3.

The lift-off method according to the first embodiment is used to transfer the optical device layer 3 of the optical device wafer 1 to a transfer substrate 10 (see FIG. 4). As illustrated in FIG. 3, the lift-off method according to the first embodiment includes a transfer substrate joining step 101, a buffer layer breaking step 102, and an optical device layer transferring step 103.

(Transfer Substrate Joining Step)

FIG. 4 schematically illustrates, in side elevation, a composite substrate formed in the transfer substrate joining step 101 of the lift-off method illustrated in FIG. 3. The transfer substrate joining step 101 is a step of joining the transfer substrate 10 to a face side 33 of the optical device layer 3 through a joining member 6, thereby forming a composite substrate According to the first embodiment, in the transfer substrate joining step 101, the transfer substrate 10, which is of a thickness of 1 mm, is joined to the face side 33 of the optical device layer 3 by the joining member 6. The transfer substrate 10 is made of molybdenum (Mo), copper (Cu), silicon (Si), or the like. According to the first embodiment, the transfer substrate 10 is made of silicon and is shaped as a circular plate having the same diameter as the optical device wafer 1.

The joining member 6 is made of metal such as AgSn, gold-tin alloy (AuSn), gold (Au), platinum (Pt), chromium (Cr), indium (In), or palladium (Pd), or an organic material such as resin. According to the first embodiment, in the transfer substrate joining step 101, the metal is vapor-deposited on, or the resin is applied to, the face side 33 of the optical device layer 3 or a face side 11 of the transfer substrate 10, forming the joining member 6 thereon. Then, the joining member 6 and the face side 11 of the transfer substrate 10 or the face side 33 of the optical device layer 3 are caused to face each other and are pressed against each other, so that the face side 11 of the transfer substrate 10 is joined to the face side 33 of the optical device layer 3 through the joining member 6, thereby forming the composite substrate 20 illustrated in FIG. 4.

According to the first embodiment, in the transfer substrate joining step 101, owing to the different lattice constants of the epitaxy substrate 2 and the transfer substrate 10, the central portion of the face side 21 of the epitaxy substrate 2 and the central portion of a reverse side 12, that is opposite the face side 11, of the transfer substrate 10 are warped so as to project when the face side 11 of the transfer substrate 10 is joined to the face side 33 of the optical device layer 3. Specifically, in the transfer substrate joining step 101, the transfer substrate 10 is warped in a manner to follow the warpage of the epitaxy substrate 2.

(Buffer Layer Breaking Step)

Figure 5:
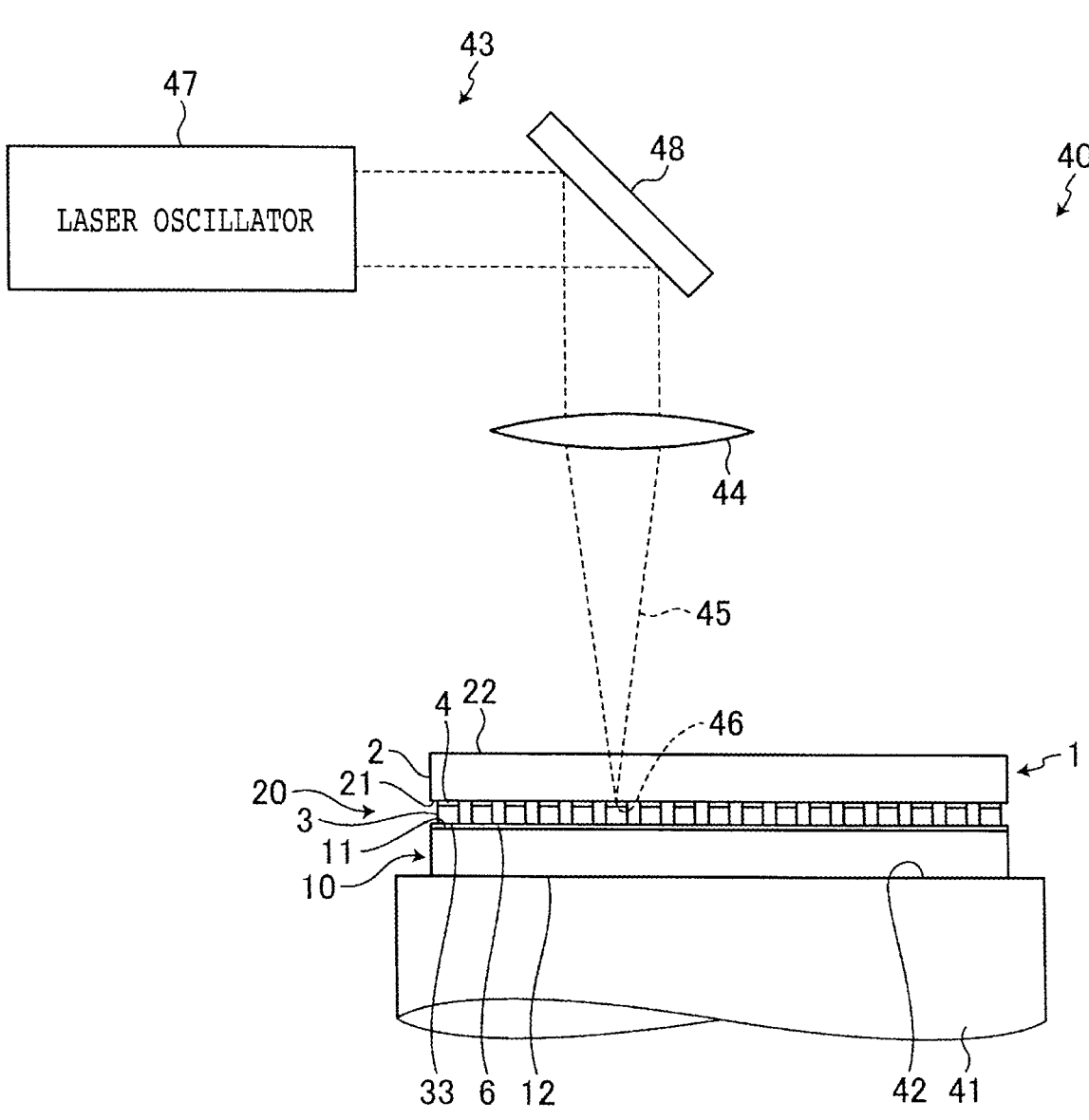
FIG. 5 is a side elevational view schematically illustrating a buffer layer breaking step of the lift-off method illustrated in FIG. 3.

FIG. 5 schematically illustrates, in side elevation, the buffer layer breaking step 102 of the lift-off method illustrated in FIG. 3. The buffer layer breaking step 102 is a step of applying a pulsed laser beam (hereinafter simply referred to "as a laser beam") 45 having a wavelength that is transmittable through the epitaxy substrate 2 and absorbable by the buffer layer 4, from the side of a reverse side 22, that is opposite the face side 21, of the epitaxy substrate 2 to the buffer layer 4, thereby breaking the buffer layer 4.

More specifically, according to the first embodiment, in the buffer layer breaking step 102, a laser processing apparatus 40 illustrated in FIG. 5 holds the reverse side 12 of the transfer substrate 10 of the composite substrate 20 under suction on a holding surface 42 of a chuck table 41. Therefore, the reverse side 22 of the epitaxy substrate 2 faces upwardly. The laser processing apparatus 40 then operates processing feed means, not illustrated, to move the chuck table 41 to processing zone below a condensing lens 44 of a laser beam applying unit 43, positioning an end of the composite substrate 20 directly below the condensing lens 44 of the laser beam applying unit 43.

According to the first embodiment, in the buffer layer breaking step 102, then, the laser processing apparatus 40 sets a focused spot 46 of the laser beam 45 emitted from the condensing lens 44, on the buffer layer 4. As illustrated in FIG. 5, the laser processing apparatus 40 emits the pulsed laser beam 45 from a laser oscillator 47 of the laser beam applying unit 43. The pulsed laser beam 45 is reflected by a mirror 48 to travel toward the condensing lens 44, from which the pulsed laser beam 45 is applied to the composite substrate 20 while at the same time the laser processing apparatus 40 moves the chuck table 41 at a predetermined processing feed speed in processing feed direction.

According to the first embodiment, in the buffer layer breaking step 102, when the other end of the composite substrate 20, i.e., the epitaxy substrate 2, has reached the position below the condensing lens 44, the laser processing apparatus 40 interrupts the application of the laser beam 45 and stops moving the chuck table 41. Thereafter, the laser processing apparatus 40 moves the condensing lens 44 of the laser beam applying unit 43 and the chuck table 41 horizontally relatively to each other in an indexing feed direction perpendicular to the processing feed direction, after which the laser processing apparatus 40 moves the chuck table 41 at the predetermined processing feed speed in the processing feed direction while at the same time applying the pulsed laser beam from the condensing lens 44 to the composite substrate 20.

According to the first embodiment, in the buffer layer breaking step 102, the laser processing apparatus repeats the process of applying the pulsed laser beam to the composite substrate 20 while moving the chuck table 41 in the processing feed direction, alternating with the process of moving the condensing lens 44 and the chuck table 41 relatively to each other in the indexing feed direction, until the laser beam 45 is applied to the buffer layer 4 all over the composite substrate 20. According to the present invention, in the buffer layer breaking step 102, the laser processing apparatus 40 may apply the laser beam 45 to the buffer layer 4 all over the composite substrate 20 by positioning the condensing lens 44 above an outermost edge of the epitaxy substrate 2 and then moving the condensing lens 44 radially inwardly toward the center of the epitaxy substrate 2 while rotating the chuck table 41 about its central axis. Moreover, according to the present invention, in the buffer layer breaking step 102, the laser processing apparatus 40 may break the buffer layer 4 by scanning the buffer layer 4 in a spiral pattern with a scanning means such as a galvanomirror, while the fixing the chuck table 41 against rotation.

According to the first embodiment, the buffer layer breaking step 102 is carried out under the following processing conditions. The laser oscillator 47 has a YAG laser as a light source. The laser beam 45 has a wavelength of 266 nm, a repetitive frequency of 50 kHz, an average output level of 0.12 W, and a pulse duration of 100 ps. The focused spot 46 is of a circular shape having a diameter of 70 μm. After the focused spot 46 has been positioned on the reverse side 22 of the epitaxy substrate 2, the condensing lens 44 is moved 1 mm closer to the epitaxy substrate 2. The processing feed speed is of 600 mm/sec.

(Optical Device Layer Transferring Step)

The optical device layer transferring step 103 is a step of, after the buffer layer breaking step 102 has been carried out, peeling off the epitaxy substrate 2 from the optical device layer 3 and transferring the optical device layer 3 to the transfer substrate 10. According to the first embodiment, as illustrated in FIG. 3, the optical device layer transferring step 103 includes a placing step 1031, an entire surface suction step 1032, and an outer peripheral portion releasing step 1033.

(Placing Step)

Figure 6:
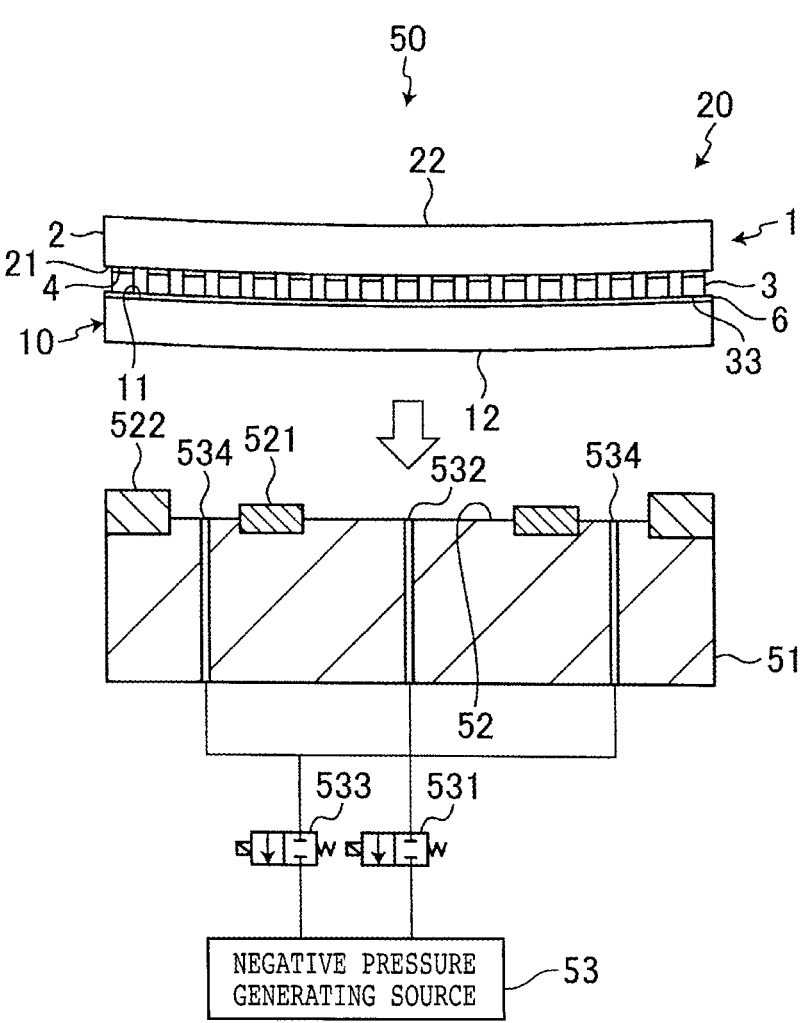
FIG. 6 is a side elevational view, partly in cross section, schematically illustrating a placing step of an optical device layer transferring step of the lift-off method illustrated in FIG. 3.

FIG. 6 schematically illustrates, in side elevation, partly in cross section, the placing step 1031 of the optical device layer transferring step 103 of the lift-off method illustrated in FIG. 3. The placing step 1031 is a step of the placing the transfer substrate 10 side of the composite substrate 20 on a horizontally flat holding surface 52 of a holding table 51 (see FIG. 6) of a separating apparatus 50.

The holding table 51 is shaped as a thick disk and is essentially identical in diameter to the composite substrate 20, the epitaxy substrate 2, and the transfer substrate 10. The holding table 51 has a central suction hole 532 defined therein that is fluidly connected to a negative pressure generating source 53 through an on/off valve 531 and that is open at the center of the holding surface 52, and a plurality of outer suction holes 534 defined therein that are fluidly connected to the negative pressure generating source 53 through an on/off valve 533 and that are open at a portion of the holding surface 52 that lies between the center of the holding surface 52 and an outer peripheral, i.e., circumferential, edge thereof. On the holding table 51, an inner ring-shaped elastic member 521 is mounted in a portion of the holding surface 52 that lies between the central suction hole 532 and the outer suction holes 534, and an outer ring-shaped elastic member 522 is mounted in a portion of the holding surface 52 that lies radially outwardly of the outer suction holes 534 along the outer peripheral edge of the holding surface 52.

Each of the elastic members 521 and 522 is made of an elastically deformable resin such as rubber and is disposed coaxially with the holding surface 52. When the elastic members 521 and 522 are not elastically deformed, the outer elastic member 522 is thicker than the inner elastic member 521. That the elastic members 521 and 522 are coaxial with each other means that the respective central axes of the elastic members 521 and 522 are aligned with the central axis of the holding surface 52. The outer elastic member 522 is made of a less hard material than the inner elastic member 521. According to the first embodiment, the inner elastic member 521 and the outer elastic member 522 are disposed in respective positions corresponding respectively to wafers such as optical device wafers having diameters of 4 and 6 inches, respectively.

According to the first embodiment, in the placing step 1031, as illustrated in FIG. 6, the reverse side 12, whose central portion projects downwardly, of the transfer substrate 10 is disposed in facing relation to the holding surface 52 of the holding table 51, and then placed on the holding surface 52 of the holding table 51.

(Entire Surface Suction Step)

Figure 7:
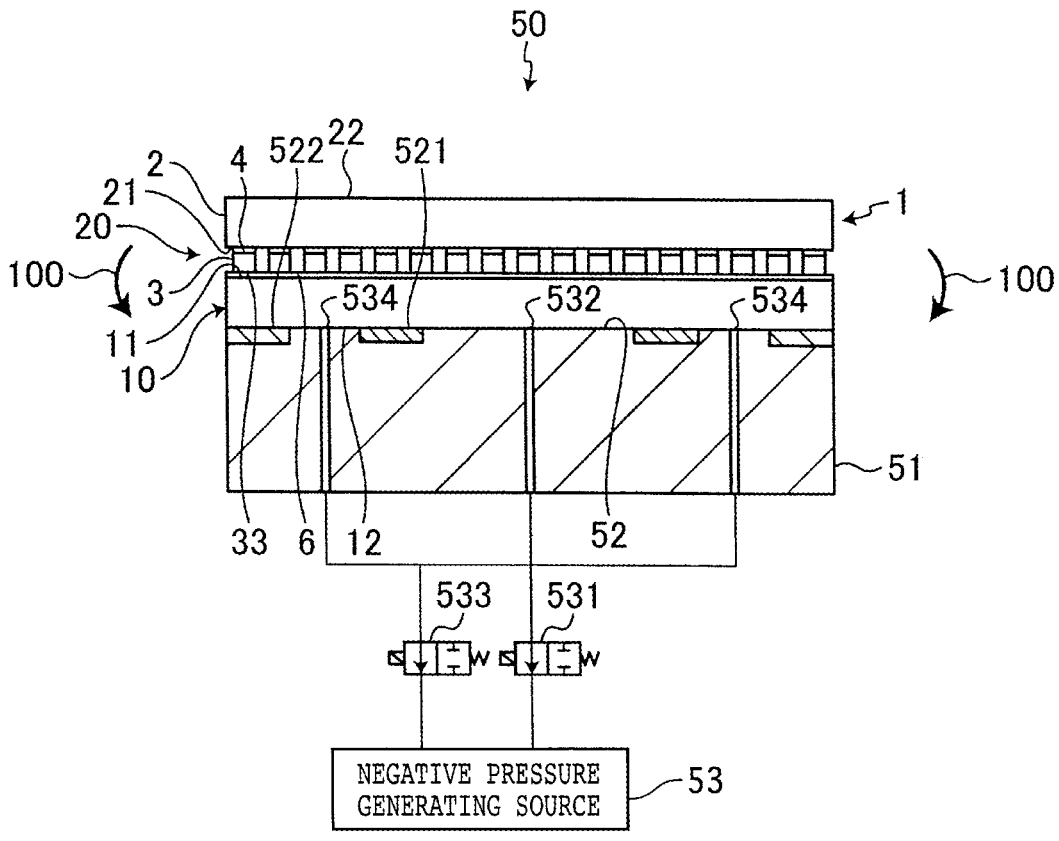
FIG. 7 is a side elevational view, partly in cross section, schematically illustrating an entire surface suction step of the optical device layer transferring step of the lift-off method illustrated in FIG. 3.

FIG. 7 schematically illustrates, in side elevation, partly in cross section, the entire surface suction step 1032 of the optical device layer transferring step 103 of the lift-off method illustrated in FIG. 3. The entire surface suction step 1032 is a step of bringing the transfer substrate 10 that is warped in a projecting manner downwardly into facing relation to the holding table 51 and attracting the entire surface of the reverse side 12 of the transfer substrate 10 under suction to the holding surface 52 of the holding table 51, thereby applying a bending moment 100 in a direction opposite the direction in which the composite substrate is warped to an area of the transfer substrate 10 that includes its outer peripheral portion.

According to the first embodiment, in the entire surface suction step 1032, the separating apparatus 50 opens the on/off valves 531 and 533 to introduce a negative pressure from the negative pressure generating source 53 into the suction holes 532 and 534, attracting the reverse side 12 in its entirety of the composite substrate 20 into intimate contact with the holding surface 52 of the holding table 51 thereby to hold the composite substrate 20 under suction on the holding surface 52 of the holding table 51. As a result, since the central portion of the reverse side 12 of the transfer substrate 10 is curved so as to project downwardly, the bending moment 100 indicated by arrows in FIG. 7 is applied to the outer peripheral portion of the transfer substrate 10 in the direction opposite the direction in which the composite substrate 20 is warped.

(Outer Peripheral Portion Releasing Step)

Figure 8:
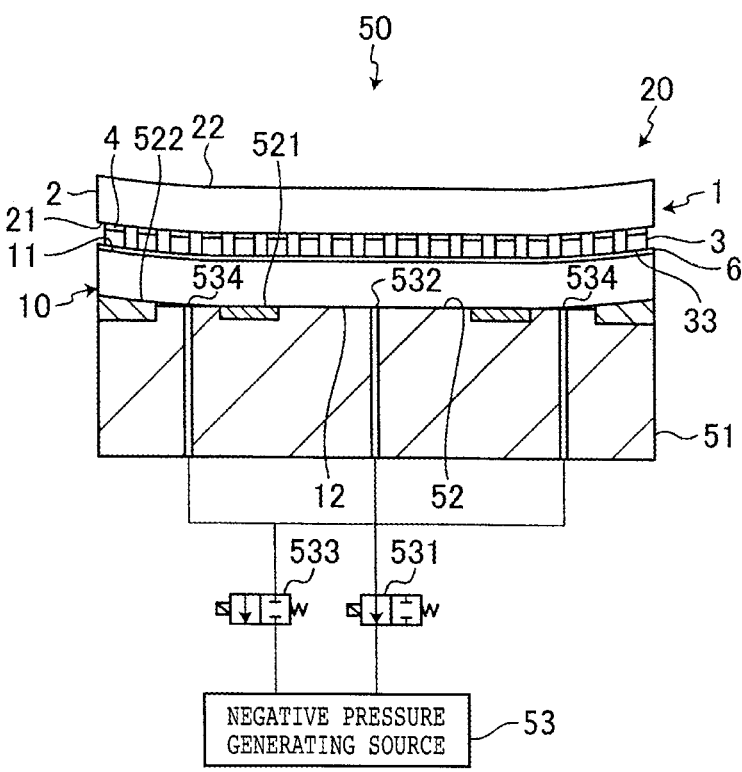
FIG. 8 is a side elevational view, partly in cross section, schematically illustrating an outer peripheral portion releasing step of the optical device layer transferring step of the lift-off method illustrated in FIG. 3.

FIG. 8 schematically illustrates, in side elevation, partly in cross section, the outer peripheral portion releasing step 1033 of the optical device layer transferring step 103 of the lift-off method illustrated in FIG. 3. The outer peripheral portion releasing step 1033 is a step of, after the entire surface suction step 1032 has been carried out, releasing an area of the composite substrate 20 that includes its outer peripheral portion from the negative pressure from the negative pressure generating source 53 while continuously holding an area of the composite substrate 20 that includes its central portion under suction on the holding surface 52 of the holding table 51.

According to the first embodiment, in the outer peripheral portion releasing step 1033, the separating apparatus 50 keeps the on/off valve 531 open to evacuate the suction hole 532 due to the negative pressure from the negative pressure generating source 53 while closing the on/off valve 533 to stop evacuating the suction holes 534. The separating apparatus 50 thus holds the central portion of the reverse side 12 of the transfer substrate under suction on the holding surface 52 while releasing the outer peripheral portion of the transfer substrate 10 from the holding surface 52, so that the bending moment 100 that has been applied is removed from the outer peripheral portion of the transfer substrate 10. Since the central portion of the reverse side 12 of the transfer substrate 10 was curved so as to project downwardly prior to the entire surface suction step 1032, when the bending moment 100 is removed from the transfer substrate 10, the central portion of the reverse side 12 of the transfer substrate 10 projects downwardly again, forcing the outer peripheral portion of the reverse side 12 of the transfer substrate 10 to be spaced upwardly away from the holding surface 52.

Thereafter, the separating apparatus 50 repeats the entire surface suction step 1032 and the outer peripheral portion releasing step 1033 a predetermined number of times, e.g., a predetermined number of times ranging from twice to twenty times, and then determines whether the entire surface suction step 1032 and the outer peripheral portion releasing step 1033 have been repeated the predetermined times or not, i.e., have been finished or not (step 104). If the separating apparatus 50 determines that the entire surface suction step 1032 and the outer peripheral portion releasing step 1033 have not been repeated the predetermined times or not, i.e., have not been finished or not (step 104: No), then the processing goes back to the entire surface suction step 1032.

In the lift-off method according to the first embodiment, as described above, by repeating the entire surface suction step 1032 and the outer peripheral portion releasing step 1033 the predetermined number of times, the bending moment 100 is repeatedly applied to the area of the composite substrate 20 that includes its outer peripheral portion while holding the area of the composite substrate 20 that includes its central portion on the holding table 51, the bending moment 100 being applied in the direction opposite the direction in which the composite substrate 20 is warped. Repeatedly applying the bending moment 100 ruptures the buffer layer 4 of the composite substrate 20 throughout the entire surface of the buffer layer 4, allowing the optical device layer 3 to be transferred to the transfer substrate 10. According to the first embodiment, the vacuum pressure, i.e., the negative pressure, applied to attract the composite substrate 20 under suction to the holding table 51 in the entire surface suction step 1032 and the outer peripheral portion releasing step 1033 is in the range from −30 kPa (gage pressure) to −60 kPa (gage pressure). Under a vacuum pressure of −20 kPa (gage pressure), it was not possible to peel off the optical device layer 3 from the epitaxy substrate 2.

If the separating apparatus 50 determines that the entire surface suction step 1032 and the outer peripheral portion releasing step 1033 have been repeated the predetermined times, i.e., have been finished (step 104: Yes), then the epitaxy substrate 2 is separated from the transfer substrate 10, transferring the optical device layer 3 to the transfer substrate 10. According to the present invention, after the outer peripheral portion releasing step 1033, the separating apparatus 50 may capture an image of the epitaxy substrate 2 from above with a camera, and determine from the captured image whether the degree of spreading of a nitrogen gas produced when GaN is decomposed has reached a predetermined value or not, thereby determining whether the processing is to go back to the entire surface suction step 1032 or not. If the separating apparatus 50 determines that the degree of spreading of a nitrogen gas has not reached the predetermined value, for example, then the processing goes back to the entire surface suction step 1032. If the separating apparatus 50 determines that the degree of spreading of a nitrogen gas has reached the predetermined value, for example, then the epitaxy substrate 2 is separated from the transfer substrate 10, transferring the optical device layer 3 to the transfer substrate 10.

In the lift-off method according to the first embodiment, as described above, the entire surface suction step 1032 and the outer peripheral portion releasing step 1033 are repeated to repeatedly apply the bending moment 100 in the direction opposite the direction in which the epitaxy substrate 2 is warped to the composite substrate 20. Consequently, even if the buffer layer 4 has not sufficiently been broken in the buffer layer breaking step 102, the epitaxy substrate 2 can smoothly be peeled off from the optical device layer 3, transferring the optical device layer 3 to the transfer substrate 10. As a result, the lift-off method according to the first embodiment is advantageous effect in that even if the buffer layer 4 has not sufficiently been broken, the epitaxy substrate 2 can smoothly be peeled off from the optical device layer 3.

Furthermore, in the lift-off method according to the first embodiment, inasmuch as the hardness of the outer elastic member 522 of the holding table 51 used in the optical device layer transferring step 103 is lower than the hardness of the inner elastic member 521, the transfer substrate 10 can be held in intimate contact with the holding surface 52 in the entire surface suction step 1032 in particular, so that the composite substrate can be held under suction on the holding table 51.

[First Modification]

Figure 9:
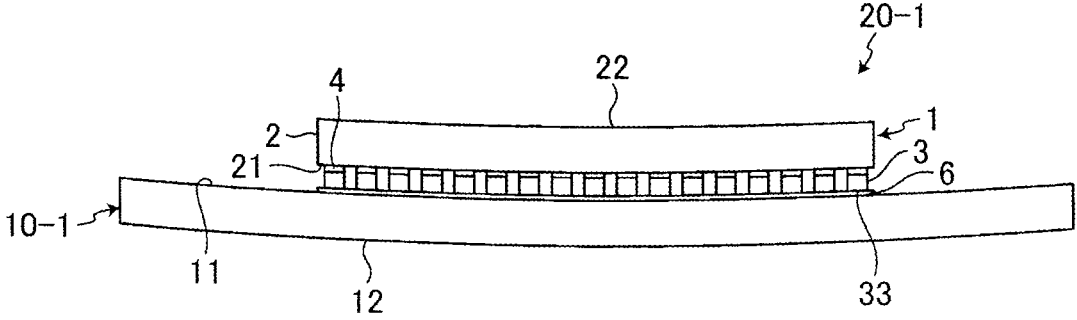
FIG. 9 is a side elevational view schematically illustrating a composite substrate formed in a transfer substrate joining step of a lift-off method according to a first modification of the first embodiment.
Figure 10:
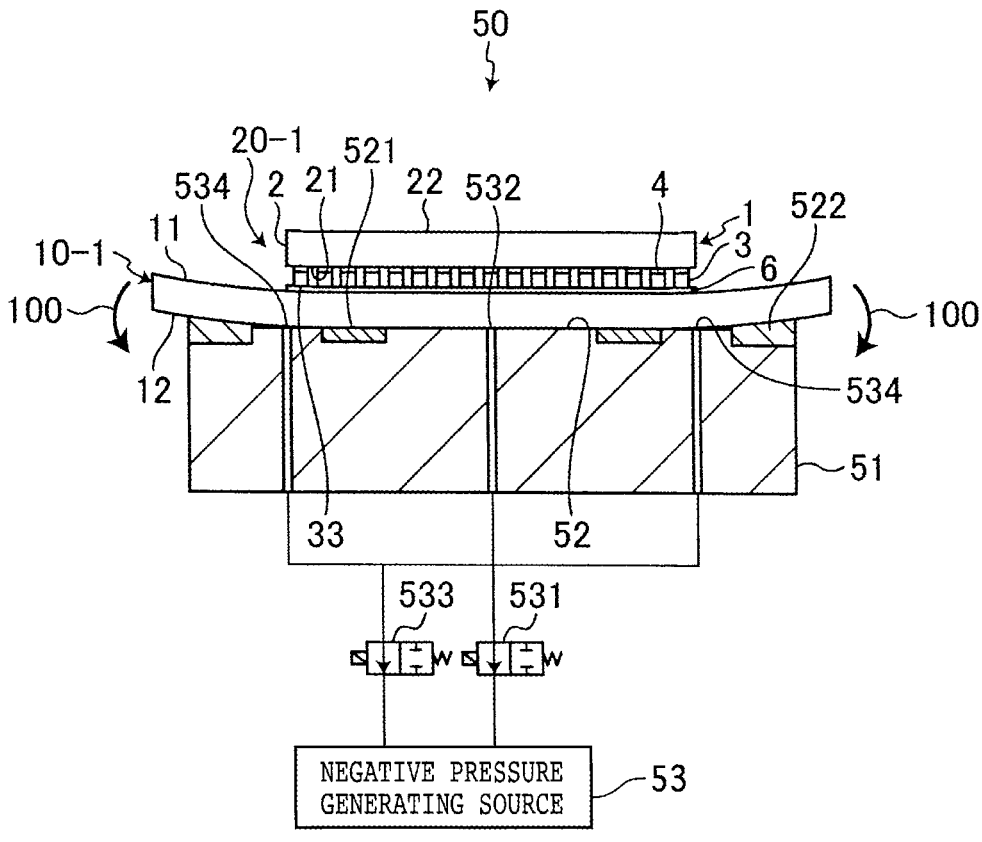
FIG. 10 is a side elevational view, partly in cross section, schematically illustrating an entire surface suction step of an optical device layer transferring step of the lift-off method according to the first modification of the first embodiment.
Figure 11:
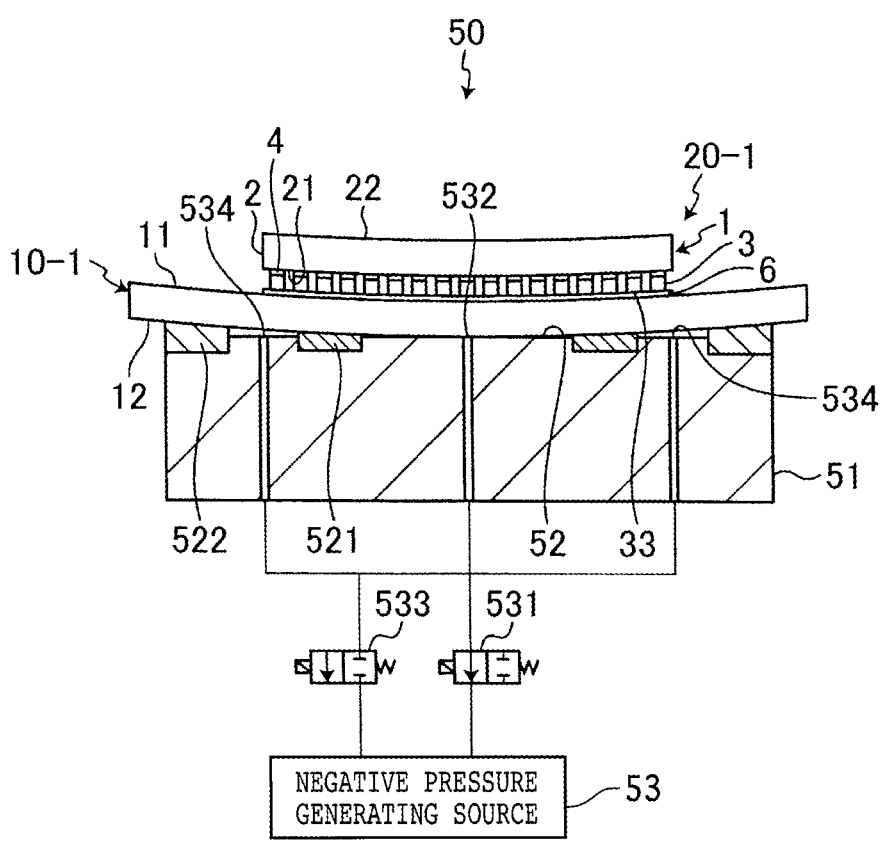
FIG. 11 is a side elevational view, partly in cross section, schematically illustrating an outer peripheral portion releasing step of the optical device layer transferring step of the lift-off method according to the first modification of the first embodiment.

A lift-off method according to a first modification of the first embodiment will be described below with reference to the drawings. FIG. 9 schematically illustrates, in side elevation, a composite substrate formed in a transfer substrate joining step of the lift-off method according to the first modification of the first embodiment. FIG. 10 schematically illustrates, in side elevation, partly in cross section, an entire surface suction step of an optical device layer transferring step of the lift-off method according to the first modification of the first embodiment. FIG. 11 schematically illustrates, in side elevation, partly in cross section, an outer peripheral portion releasing step of the optical device layer transferring step of the lift-off method according to the first modification of the first embodiment. In FIGS. 9, 10, and 11, those parts that are identical to those according to the first embodiment are denoted by identical reference signs, and will be omitted from description.

The lift-off method according to the first modification of the first embodiment is similar to the lift-off method according to the first embodiment except that a transfer substrate 10-1 of a composite substrate 20-1 is larger in diameter than the optical device wafer 1 and the transfer substrate 10-1 has an outer peripheral portion protruding radially outwardly from an outer edge of the optical device wafer 1 all along its peripheral portion, as illustrated in FIGS. 9, 10, and 11. According to the first modification of the first embodiment, the optical device wafer 1 has a diameter of 4 inches and the transfer substrate 10-1 has a diameter of 8 inches.

In the lift-off method according to the first modification of the first embodiment, the entire surface suction step 1032 and the outer peripheral portion releasing step 1033 are repeated to repeatedly apply the bending moment 100 in the direction opposite the direction in which the composite substrate 20 is warped to the composite substrate 20-1, as with the first embodiment. Consequently, the lift-off method according to the first modification of the first embodiment is advantageous effect in that even if the buffer layer 4 has not sufficiently been broken, the epitaxy substrate 2 can smoothly be peeled off from the optical device layer 3.

[Second Modification]

Figure 12:
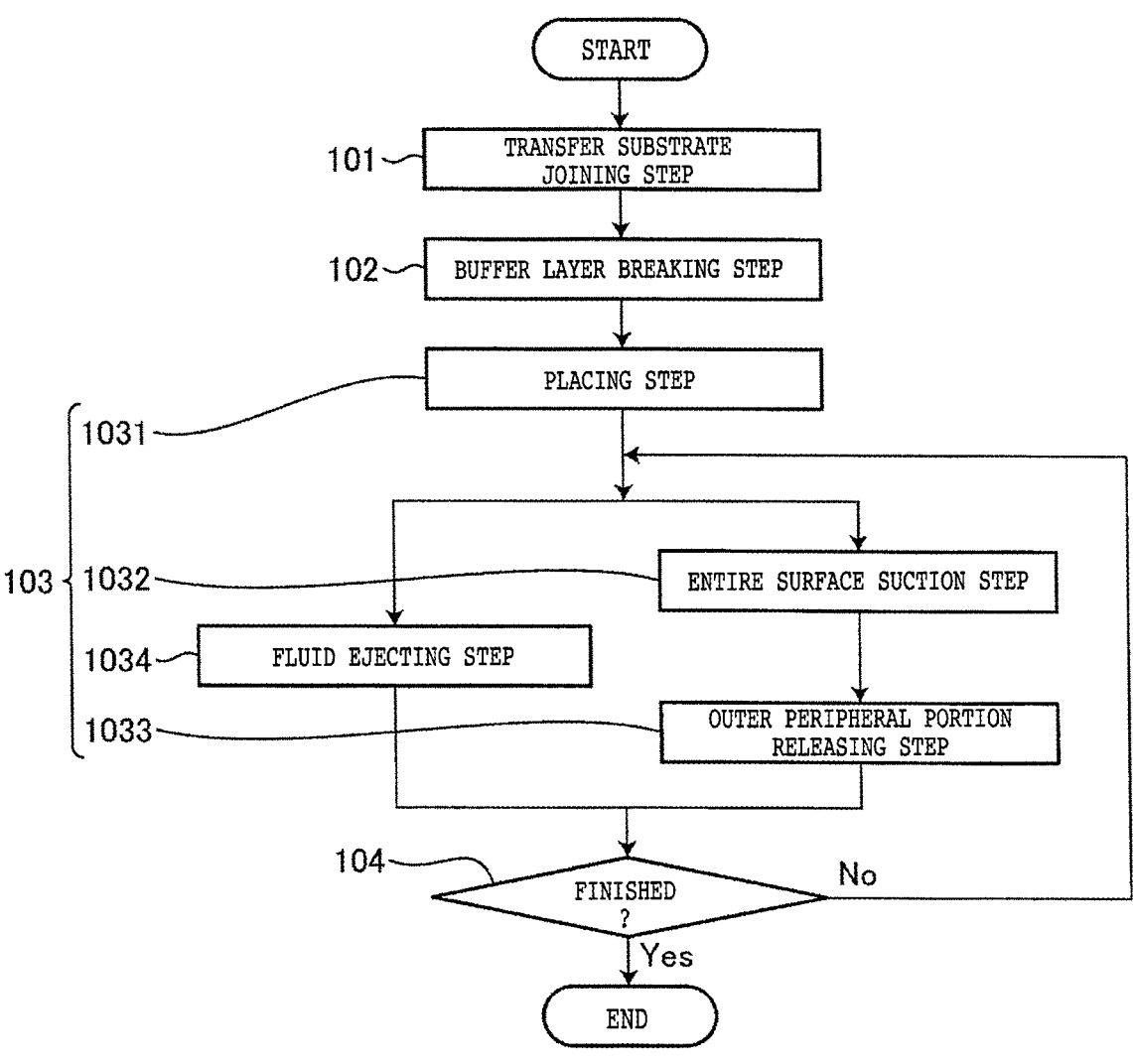
FIG. 12 is a flowchart of the sequence of a lift-off method according to a second modification of the first embodiment.
Figure 13:
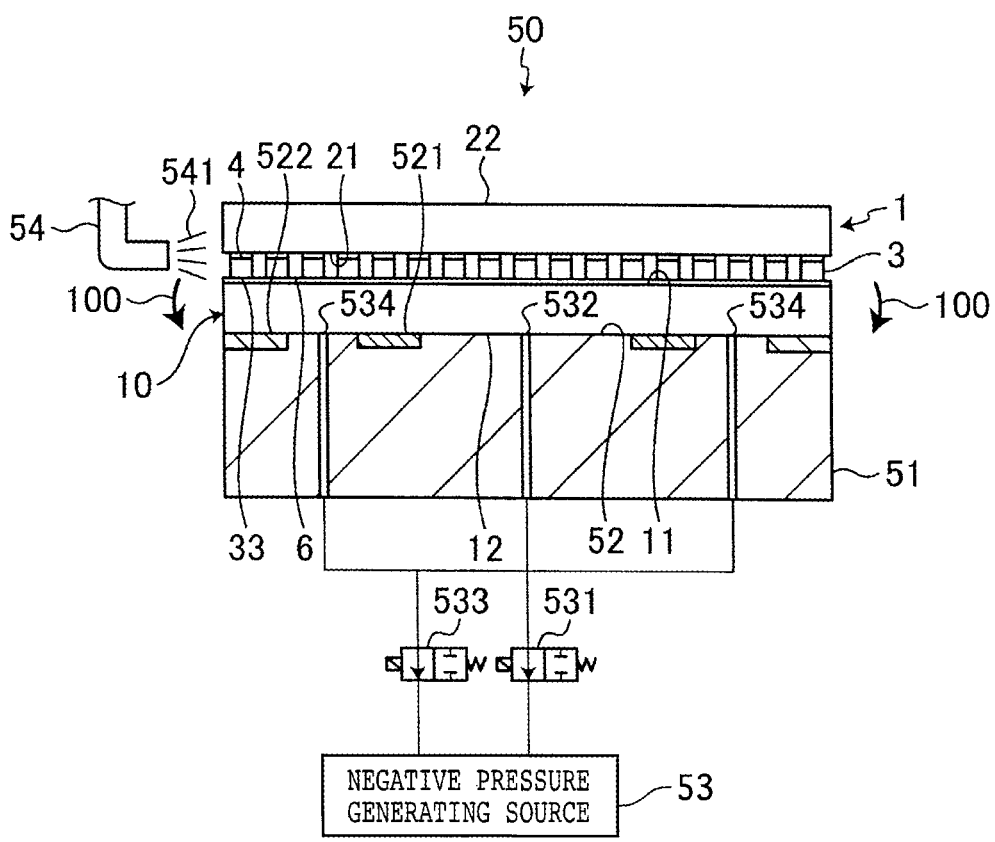
FIG. 13 is a side elevational view, partly in cross section, schematically illustrating a fluid ejecting step of the lift-off method illustrated in FIG. 12.

A lift-off method according to a second modification of the first embodiment will be described below with reference to the drawings. FIG. 12 is a flowchart of the sequence of the lift-off method according to the second modification of the first embodiment. FIG. 13 schematically illustrates, in side elevation, partly in cross section, a fluid ejecting step of the lift-off method illustrated in FIG. 12. In FIGS. 12 and 13, those parts that are identical to those according to the first embodiment are denoted by identical reference signs, and will be omitted from description.

As illustrated in FIG. 12, the lift-off method according to the second modification of the first embodiment is similar to the lift-off method according to the first embodiment except that the optical device layer transferring step 103 includes a fluid ejecting step 1034. The fluid ejecting step 1034 is a step of ejecting a fluid 541 to the buffer layer 4 that is disposed at the boundary between the epitaxy substrate 2 and the transfer substrate 10 of the composite substrate 20.

According to the second modification of the first embodiment, in the fluid ejecting step 1034, while the separating apparatus 50 is repeating the entire surface suction step 1032 and the outer peripheral portion releasing step 1033, a fluid ejecting nozzle 54 ejects a fluid 541, which is a pressurized gas according to the second modification of the first embodiment, toward the buffer layer 4 at the boundary between the epitaxy substrate 2 and the transfer substrate 10, as illustrated in FIG. 13.

According to the second modification of the first embodiment, in the fluid ejecting step 1034, the separating apparatus 50 as it is repeating the entire surface suction step 1032 and the outer peripheral portion releasing step 1033 may eject the fluid 541 from the fluid ejecting nozzle 54 to the buffer layer 4 while appropriately changing the position of the fluid ejecting nozzle 54, or may eject the fluid 541 to the buffer layer 4 without changing the position of the fluid ejecting nozzle 54 that has an inside diameter of approximately 3 mm, for example. Moreover, according to the second modification of the first embodiment, in the fluid ejecting step 1034, the fluid ejecting nozzle 54 should preferably eject the fluid 541 at a flow rate of 30 l/min. or higher, and may blow the fluid 541 continuously at all times or may blow the fluid 541 in pulses at 5 Hz through 6 Hz, though blowing the fluid 541 in pulses is more effective.

The lift-off method according to the second modification of the first embodiment, as with the first embodiment, is advantageous effect in that since the entire surface suction step 1032 and the outer peripheral portion releasing step 1033 are repeated to repeatedly apply the bending moment 100 in the direction opposite the direction in which the epitaxy substrate 2 is warped to the composite substrate 20-1, even if the buffer layer 4 has not sufficiently been broken, the epitaxy substrate 2 can smoothly be peeled off from the optical device layer 3.

Furthermore, in the lift-off method according to the second modification of the first embodiment, because the fluid ejecting nozzle 54 ejects the fluid 541 to the buffer layer 4 while the entire surface suction step 1032 and the outer peripheral portion releasing step 1033 are being repeated, the transfer substrate 10 and the epitaxy substrate 2 can be peeled off from each other by the fluid 541.

According to the second modification of the first embodiment, as with the first modification of the first embodiment, the transfer substrate 10-1 of the composite substrate 20-1 may be larger or smaller in diameter than the optical device wafer 1.

[Third Modification]

Figure 14:
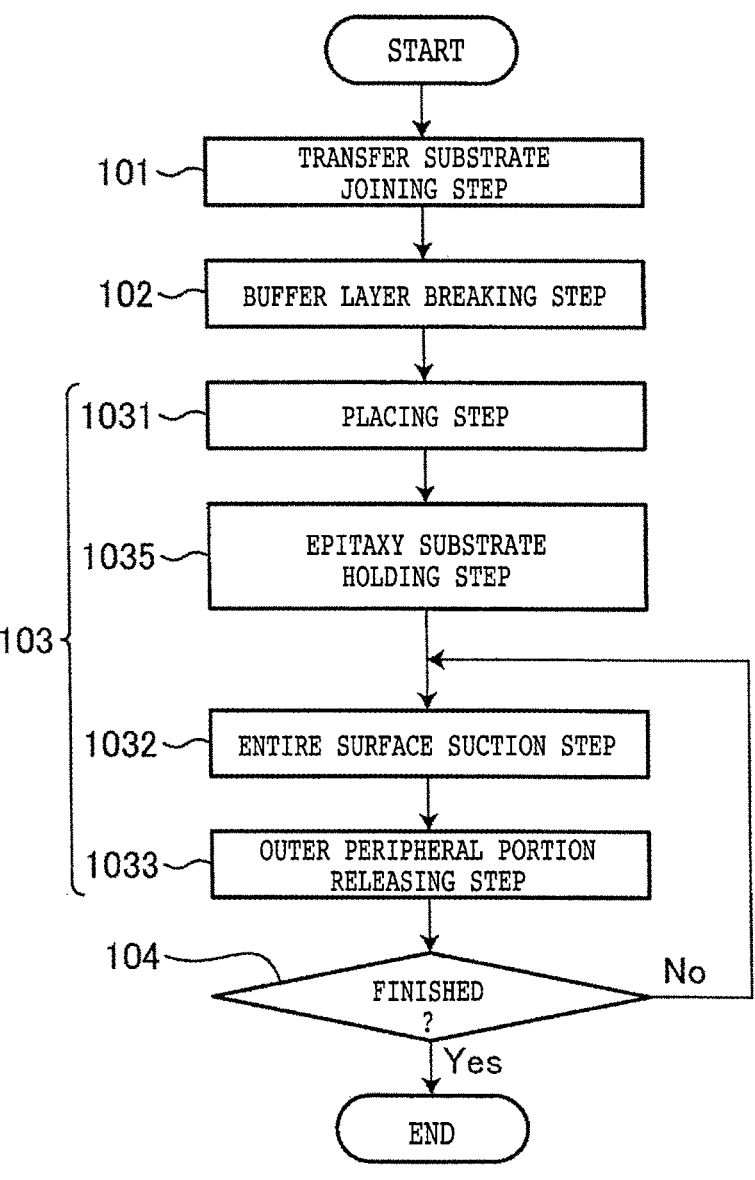
FIG. 14 is a flowchart of the sequence of a lift-off method according to a third modification of the first embodiment.
Figure 15:
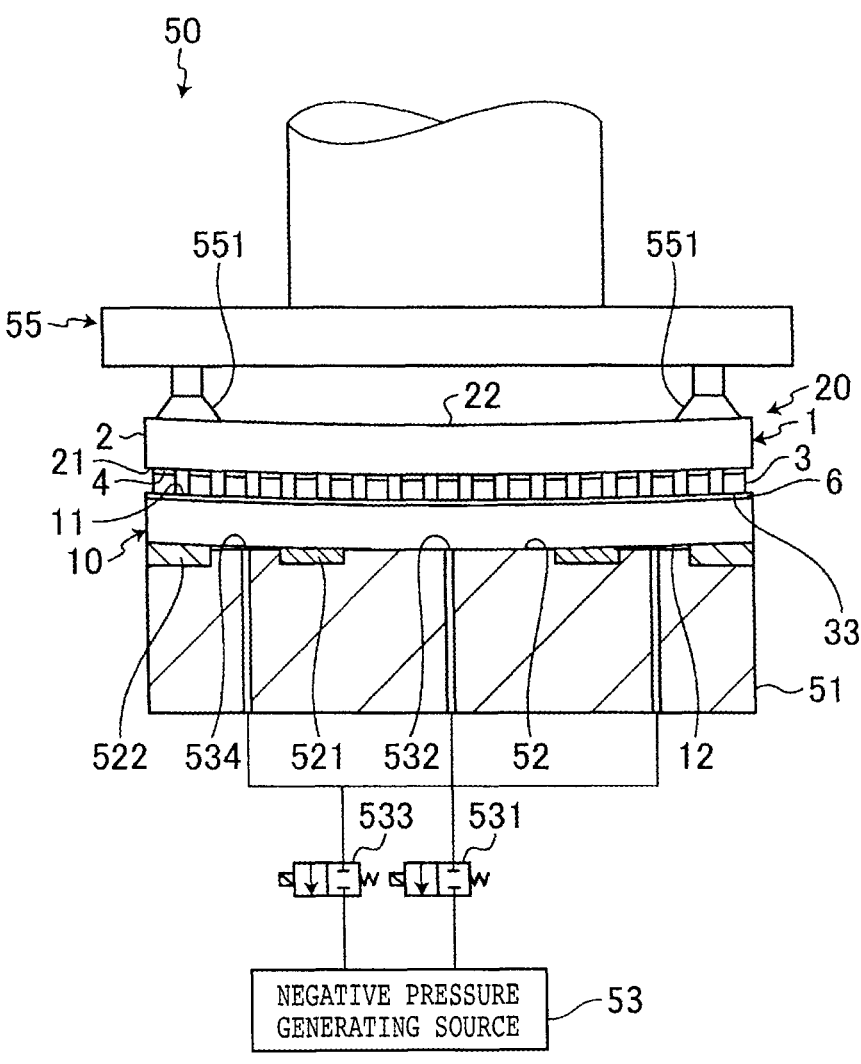
FIG. 15 is a side elevational view, partly in cross section, schematically illustrating an epitaxy substrate holding step of the lift-off method illustrated in FIG. 14.

A lift-off method according to a third modification of the first embodiment will be described below with reference to the drawings. FIG. 14 is a flowchart of the sequence of the lift-off method according to the third modification of the first embodiment. FIG. 15 schematically illustrates, in side elevation, partly in cross section, an epitaxy substrate holding step of the lift-off method illustrated in FIG. 14. In FIGS. 14 and those parts that are identical to those according to the first embodiment are denoted by identical reference signs, and will be omitted from description.

As illustrated in FIG. 14, the lift-off method according to the third modification of the first embodiment is similar to the lift-off method according to the first embodiment except that the optical device layer transferring step 103 includes an epitaxy substrate holding step 1035. The epitaxy substrate holding step 1035 is a step of holding the epitaxy substrate 2 side of the composite substrate 20 under suction.

According to the third modification of the first embodiment, in the epitaxy substrate holding step 1035, after having carried out the placing step 1031 and before repeating the entire surface suction step 1032 and the outer peripheral portion releasing step 1033, the separating apparatus 50 holds the outer peripheral portion or central portion of the epitaxy substrate 2 of the composite substrate 20 under suction on suction pads 551 of a peeling unit 55 that peels off the epitaxy substrate 2 from the transfer substrate 10, as illustrated in FIG. 15. According to the third modification of the first embodiment, while repeating the entire surface suction step 1032 and the outer peripheral portion releasing step 1033, the separating apparatus 50 may move the peeling unit 55 vertically in a manner to follow the movement of the outer peripheral portion of the composite substrate 20 or may not move the peeling unit 55 vertically.

The lift-off method according to the third modification of the first embodiment, as with the first embodiment, is advantageous effect in that since the entire surface suction step 1032 and the outer peripheral portion releasing step 1033 are repeated to repeatedly apply the bending moment 100 in the direction opposite the direction in which the epitaxy substrate 2 is warped to the composite substrate 20, even if the buffer layer 4 has not sufficiently been broken, the epitaxy substrate 2 can smoothly be peeled off from the optical device layer 3.

Moreover, the lift-off method according to the third modification of the first embodiment can peel off the transfer substrate 10 and the epitaxy substrate 2 from each other as the outer peripheral portion or central portion of the epitaxy substrate 2 of the composite substrate 20 is held under suction on the suction pads 551 before the entire surface suction step 1032 and the outer peripheral portion releasing step 1033 are repeated.

According to the third modification of the first embodiment, as with the first modification of the first embodiment, the transfer substrate 10-1 of the composite substrate 20-1 may be larger or smaller in diameter than the optical device wafer 1.

Second Embodiment

Figure 16:
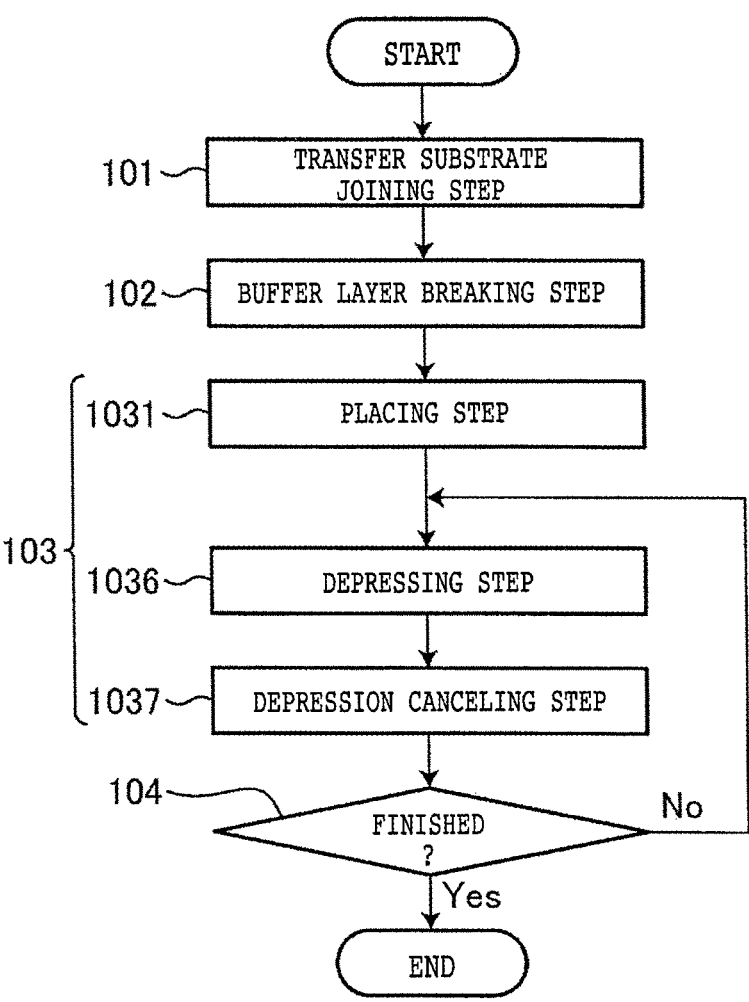
FIG. 16 is a flowchart of the sequence of a lift-off method according to a second embodiment of the present invention.
Figure 17:
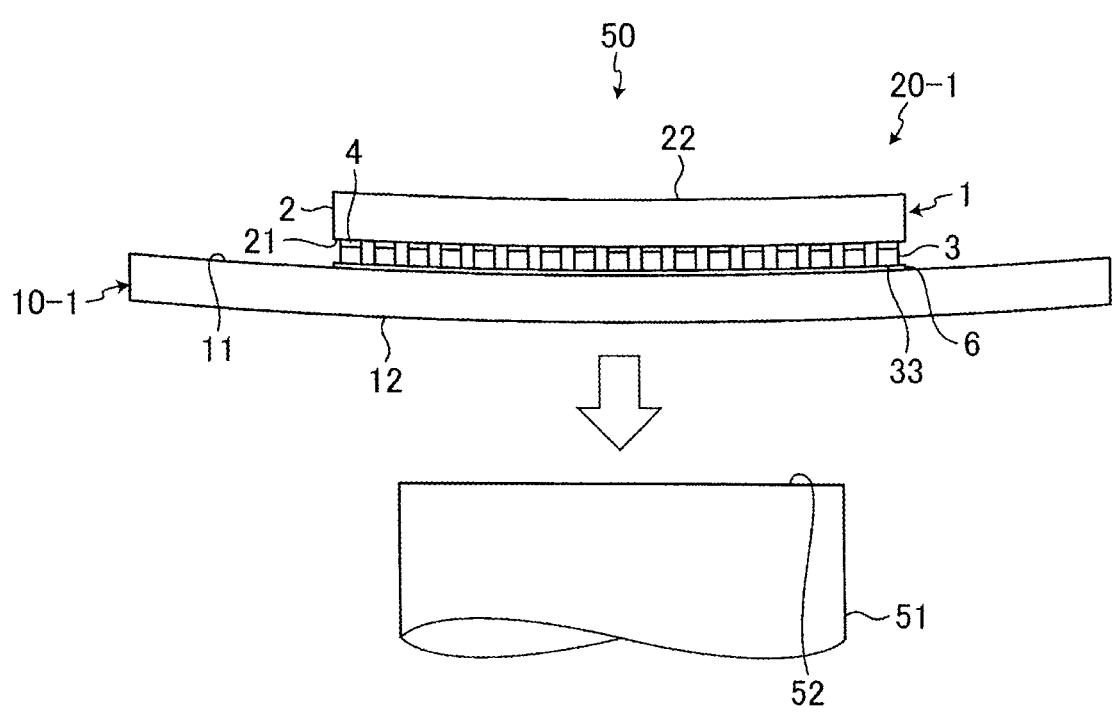
FIG. 17 is a side elevational view schematically illustrating a placing step of an optical device layer transferring step of the lift-off method illustrated in FIG. 16.
Figure 18:
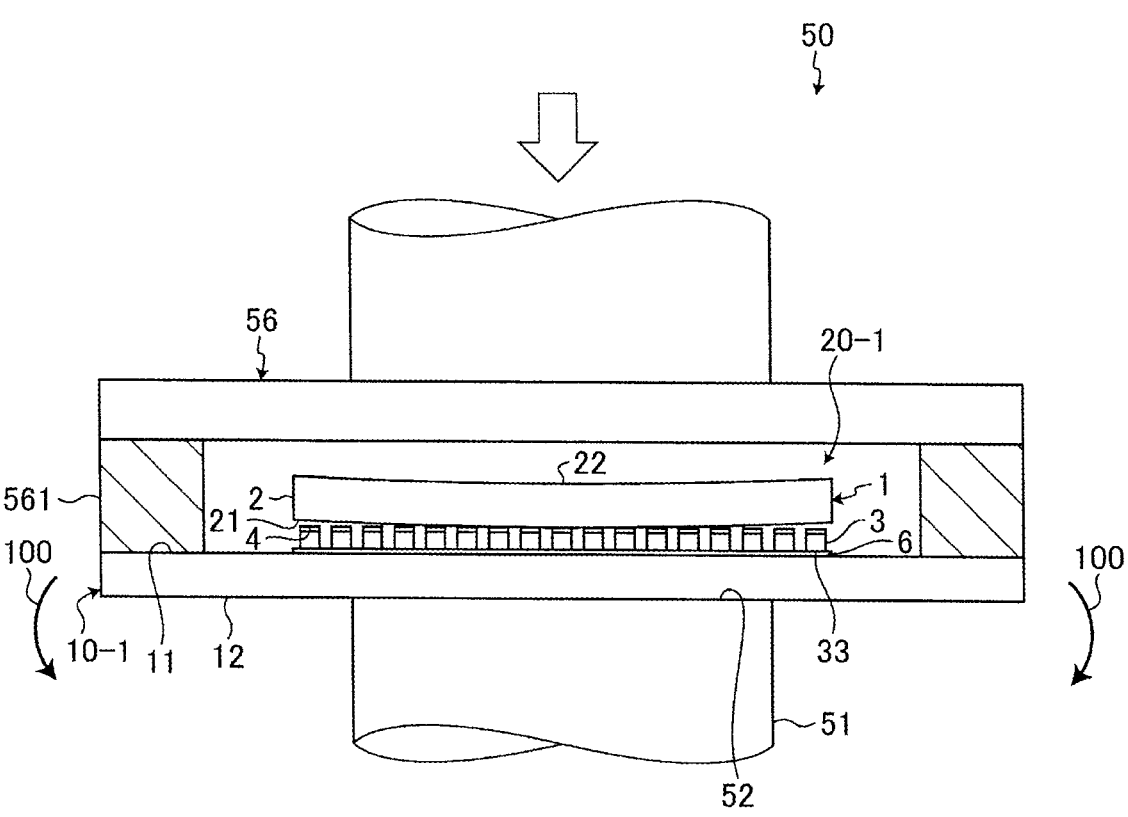
FIG. 18 is a side elevational view, partly in cross section, schematically illustrating a pressing step of the optical device layer transferring step of the lift-off method illustrated in FIG. 16.
Figure 19:
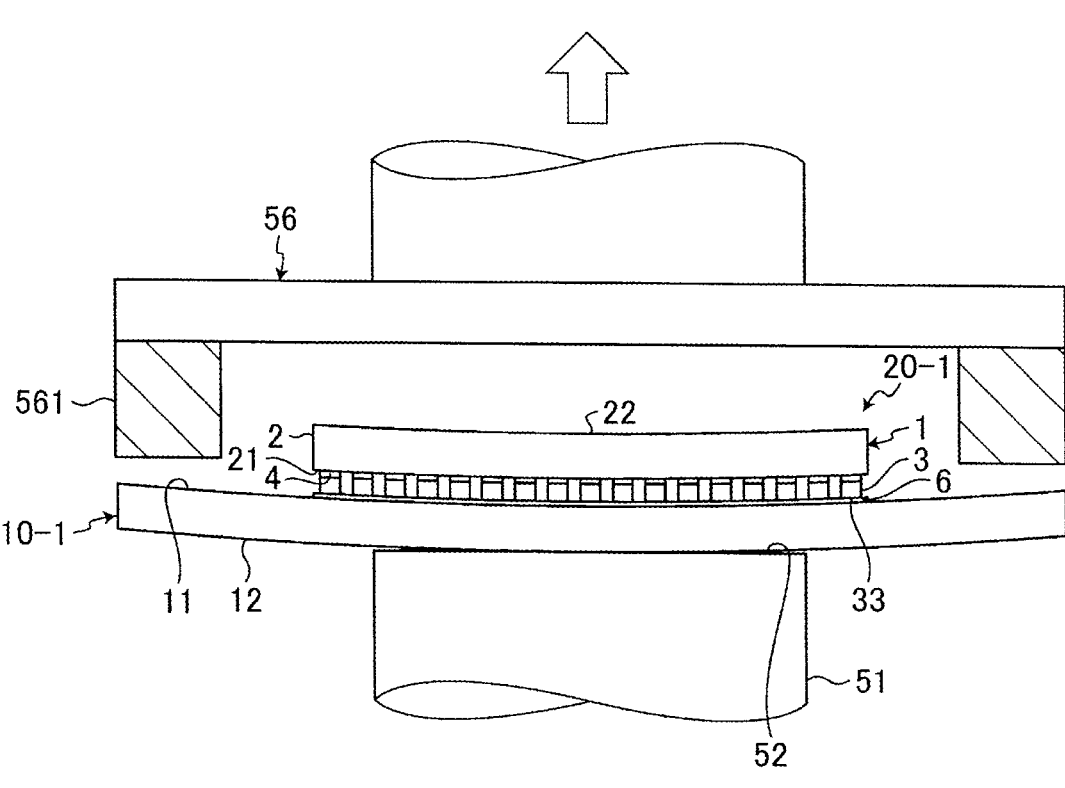
FIG. 19 is a side elevational view, partly in cross section, schematically illustrating a depression canceling step of the optical device layer transferring step of the lift-off method illustrated in FIG. 16.

A lift-off method according to a second embodiment of the present invention will be described below with reference to the drawings. FIG. 16 is a flowchart of the sequence of the lift-off method according to the second embodiment. FIG. 17 schematically illustrates, in side elevation, a placing step of an optical device layer transferring step of the lift-off method illustrated in FIG. 16. FIG. 18 schematically illustrates, in side elevation, partly in cross section, a pressing step of the optical device layer transferring step of the lift-off method illustrated in FIG. 16. FIG. 19 schematically illustrates, in side elevation, partly in cross section, a depression canceling step of the optical device layer transferring step of the lift-off method illustrated in FIG. 16. In FIGS. 16, 17, 18, and 19, those parts that are identical to those according to the first embodiment are denoted by identical reference signs, and will be omitted from description.

The lift-off method according to the second embodiment is similar to the lift-off method according to the first embodiment except that the optical device transferring step 103 includes the placing step 1031, the depressing step 1036, and the depression canceling step 1037, as illustrated in FIG. 16.

The lift-off method according to the second embodiment includes the placing step 1031 in which, as illustrated in FIG. 17, the reverse side 12, whose central portion is curved so as to project downwardly, of the transfer substrate 10-1 of the composite substrate is caused to face the holding surface 52 of the holding table 51 of the separating apparatus 50, and is then placed on the holding surface 52 that lies flat horizontally.

The depressing step 1036 of the optical device layer transferring step 103 of the lift-off method according to the second embodiment is a step of, while the composite substrate 20-1 is being placed on the holding table 51 with the transfer substrate that is warped in a projecting manner 10-1 facing the holding table 51, depressing the area of the composite substrate including the outer peripheral portion thereof from the epitaxy substrate 2 side of the composite substrate thereby applying the bending moment 100 in the direction opposite the direction in which the composite substrate 20-1 is warped to the area of the transfer substrate 10-1 including the outer peripheral portion thereof.

According to the second embodiment, in the depressing step 1036, the separating apparatus 50 brings a depressing member 561 (see FIG. 18) of a depressing unit 56 from the epitaxy substrate 2 side into abutment against the outer peripheral portion of the face side 11 of the transfer substrate 10-1 of the composite substrate placed on the holding table 51, and, as illustrated in FIG. 18, moves the depressing unit 56 closer to the holding table 51, causing the depressing member 561 to depress the outer peripheral portion of the transfer substrate 10-1 toward the holding table 51. Now, the bending moment 100 is applied to the outer peripheral portion of the transfer substrate 10-1, breaking at least a portion of the buffer layer 4 in the buffer layer breaking step 102. Therefore, the optical device layer 3 is separated from the epitaxy substrate 2 in the outer peripheral portion of the composite substrate 20-1.

The depression canceling step 1037 of the optical device layer transferring step 103 of the lift-off method according to the second embodiment is a step of canceling the depression of the area of the composite substrate 20-1 including the outer peripheral portion the transfer substrate 10-1 that has been depressed in the depressing step 1036. According to the second embodiment, in the depression canceling step 1037, the separating apparatus lifts the depressing unit 56 away from the holding table 51, spacing the depressing member 561 apart from the outer peripheral portion of the face side 11 of the transfer substrate 10-1, as illustrated in FIG. 19, thereby to cancel the depression of the transfer substrate 10-1. Since the central portion of the reverse side 12 of the transfer substrate 10-1 was curved so as to project downwardly prior to the depressing step 1036, when the bending moment 100 is removed from the transfer substrate 10-1, the central portion of the reverse side 12 of the transfer substrate 10-1 projects downwardly again, forcing the outer peripheral portion of the reverse side 12 of the transfer substrate 10-1 to be spaced upwardly away from the holding surface 52.

Thereafter, the separating apparatus 50 repeats the depressing step 1036 and the depression canceling step 1037 a predetermined number of times, e.g., a predetermined number of times ranging from twice to twenty times, and then determines whether the depressing step 1036 and the depression canceling step 1037 have been repeated the predetermined times or not, i.e., have been finished or not (step 104). If the separating apparatus 50 determines that the depressing step 1036 and the depression canceling step 1037 have not been repeated the predetermined times or not, i.e., have not been finished or not (step 104: No), then the processing goes back to the depressing step 1036.

In the lift-off method according to the second embodiment, as described above, by repeating the depressing step 1036 and the depression canceling step 1037 the predetermined number of times, the bending moment 100 is repeatedly applied to the area of the composite substrate 20-1 that includes its outer peripheral portion while holding the area of the composite substrate 20-1 that includes its central portion on the holding table 51, the bending moment 100 being applied in the direction opposite the direction in which the composite substrate 20-1 is warped. Repeatedly applying the bending moment 100 ruptures the buffer layer 4 throughout its entire surface, allowing the composite substrate 20-1 the optical device layer 3 to be transferred to the transfer substrate 10-1.

If the separating apparatus 50 determines that the depressing step 1036 and the depression canceling step 1037 have been repeated the predetermined times, i.e., have been finished (step 104: Yes), then the epitaxy substrate 2 is separated from the transfer substrate 10-1, transferring the optical device layer 3 to the transfer substrate 10-1. According to the present invention, after the depression canceling step 1037, the separating apparatus 50 may capture an image of the epitaxy substrate 2 from above with a camera, and determine from the captured image whether the degree of spreading of a nitrogen gas produced when GaN is decomposed has reached a predetermined value or not, thereby determining whether the processing is to go back to the depressing step 1036 or not. If the separating apparatus 50 determines that the degree of spreading of a nitrogen gas has not reached the predetermined value, for example, then the processing goes back to the depressing step 1036. If the separating apparatus 50 determines that the degree of spreading of a nitrogen gas has reached the predetermined value, for example, then the epitaxy substrate 2 is separated from the transfer substrate 10-1, transferring the optical device layer 3 to the transfer substrate 10-1.

In the lift-off method according to the second embodiment, the depressing step 1036 and the depression canceling step 1037 are repeated to repeatedly apply the bending moment 100 in the direction opposite the direction in which the composite substrate 20-1 is warped to the composite substrate 20-1. Consequently, even if the buffer layer 4 has not sufficiently been broken in the buffer layer breaking step 102, the epitaxy substrate 2 can smoothly be peeled off from the optical device layer 3, transferring the optical device layer 3 to the transfer substrate 10-1. As a result, the lift-off method according to the second embodiment is advantageous effect in that even if the buffer layer 4 has not sufficiently been broken, the epitaxy substrate 2 can smoothly be peeled off from the optical device layer 3.

[First Modification]

Figure 20:
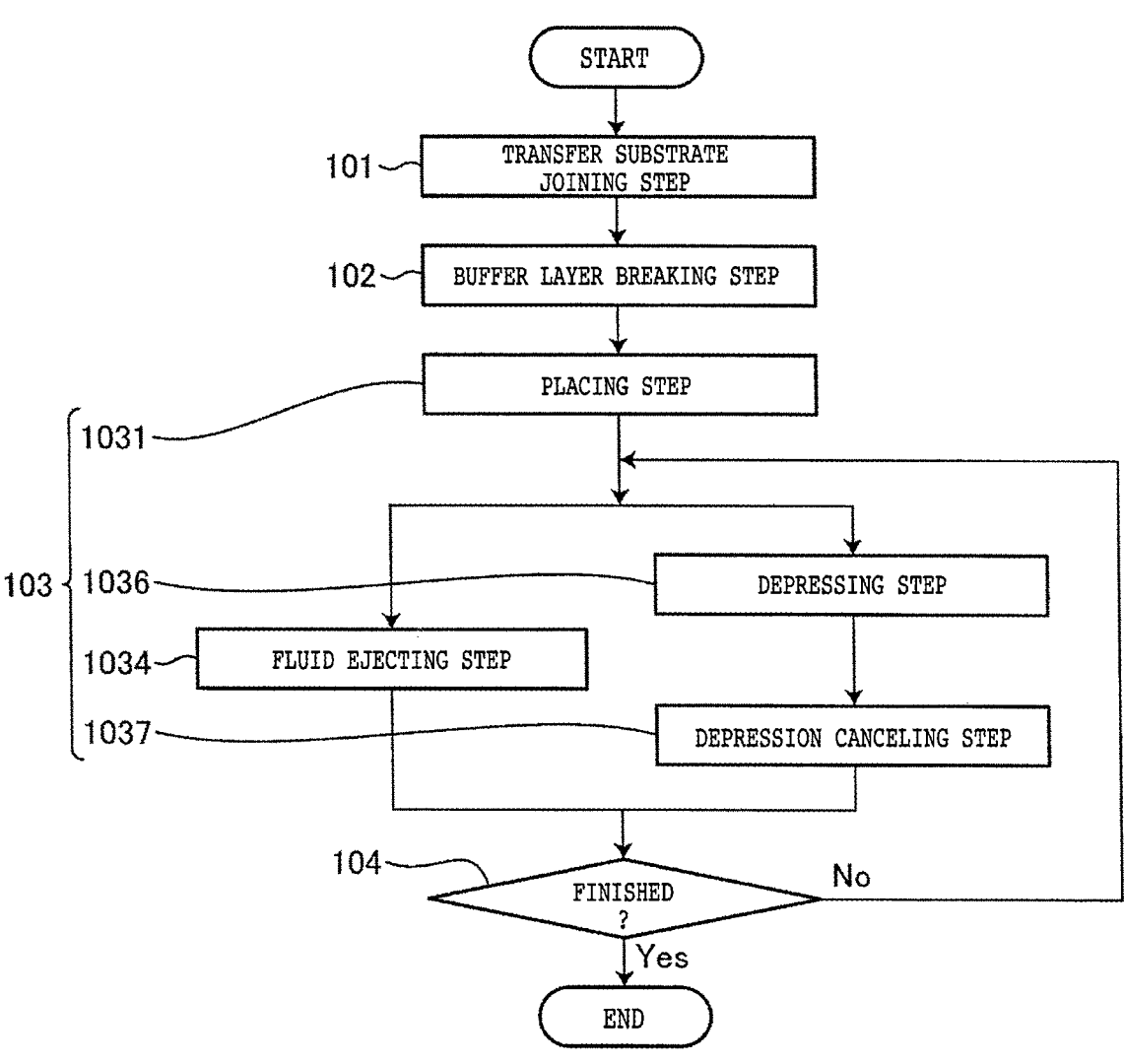
FIG. 20 is a flowchart of the sequence of a lift-off method according to a first modification of the second embodiment.

FIG. 20 is a flowchart of the sequence of a lift-off method according to a first modification of the second embodiment. In FIG. 20, those parts that are identical to those according to the first embodiment are denoted by identical reference signs, and will be omitted from description.

As illustrated in FIG. 20, the lift-off method according to the first modification of the second embodiment, as with the second modification of the first embodiment, is similar to the lift-off method according to the second embodiment except that the optical device layer transferring step 103 includes the fluid ejecting step 1034. The fluid ejecting step 1034 is a step of ejecting a fluid 541 to the buffer layer 4 that is disposed at the boundary between the epitaxy substrate 2 and the transfer substrate 10-1 of the composite substrate 20-1.

According to the first modification of the second embodiment, in the fluid ejecting step 1034, while the separating apparatus 50 is repeating the depressing step 1036 and the depression canceling step 1037, the fluid ejecting nozzle 54 ejects the fluid 541, which is a pressurized gas according to the first modification of the second embodiment, toward the buffer layer 4 at the boundary between the epitaxy substrate 2 and the transfer substrate 10-1.

The lift-off method according to the first modification of the second embodiment, as with the second embodiment, is advantageous effect in that since the depressing step 1036 and the depression canceling step 1037 are repeated to repeatedly apply the bending moment 100 in the direction opposite the direction in which the epitaxy substrate 2 is warped to the composite substrate even if the buffer layer 4 has not sufficiently been broken, the epitaxy substrate 2 can smoothly be peeled off from the optical device layer 3.

Furthermore, in the lift-off method according to the first modification of the second embodiment, because the fluid ejecting nozzle 54 ejects the fluid 541 to the buffer layer 4 while the depressing step 1036 and the depression canceling step 1037 are being repeated, the transfer substrate 10-1 and the epitaxy substrate 2 can be peeled off from each other by the fluid 541.

[Second Modification]

A lift-off method according to a second modification of the second embodiment will be described below with reference to the drawings. FIG. 21 is a flowchart of the sequence of the lift-off method according to the second modification of the second embodiment. FIG. 22 schematically illustrates, in side elevation, partly in cross section, an epitaxy substrate holding step of the lift-off method illustrated in FIG. 21. In FIGS. 21 and 22, those parts that are identical to those according to the second embodiment are denoted by identical reference signs, and will be omitted from description.

As illustrated in FIG. 21, the lift-off method according to the second modification of the second embodiment is similar to the lift-off method according to the third modification of the first embodiment except that the optical device layer transferring step 103 includes the epitaxy substrate holding step 1035. The Epitaxy substrate holding step 1035 is a step of holding the epitaxy substrate 2 side of the composite substrate 20-1 under suction.

According to the second modification of the second embodiment, in the epitaxy substrate holding step 1035, after having carried out the placing step 1031 and before repeating the depressing step 1036 and the depression canceling step 1037, the separating apparatus 50 holds the outer peripheral portion or central portion of the epitaxy substrate 2 of the composite substrate 20-1 under suction on suction pads 562 of the depressing unit 56, as illustrated in FIG. 22. According to the second modification of the second embodiment, the suction pads 562 are vertically movable independently of the depressing member 561. According to the second modification of the second embodiment, while repeating the depressing step 1036 and the depression canceling step 1037, the separating apparatus 50 may move the suction pads 562 of the depressing unit 56 vertically in a manner to follow the movement of the outer peripheral portion of the composite substrate 20-1 or may not move the suction pads 562 vertically.

The lift-off method according to the second modification of the second embodiment, as with the second embodiment, is advantageous effect in that the depressing step 1036 and the depression canceling step 1037 are repeated to repeatedly apply the bending moment 100 in the direction opposite the direction in which the epitaxy substrate 2 is warped to the composite substrate 20-1. Consequently, even if the buffer layer 4 has not sufficiently been broken, the epitaxy substrate 2 can smoothly be peeled off from the optical device layer 3.

Moreover, the lift-off method according to the second modification of the second embodiment can peel off the transfer substrate 10-1 and the epitaxy substrate 2 from each other as the outer peripheral portion or central portion of the epitaxy substrate 2 of the composite substrate 20-1 is held under suction on the suction pads 562 before the depressing step 1036 and the depression canceling step 1037 are repeated.

Third Embodiment

A lift-off method according to a third embodiment of the present invention will be described below with reference to the drawings. FIG. 23 is a flowchart of the sequence of the lift-off method according to the third embodiment. FIG. 24 schematically illustrates, in side elevation, a placing step of an optical device layer transferring step of the lift-off method illustrated in FIG. 23. FIG. 25 schematically illustrates, in side elevation, a pulling step of the optical device layer transferring step of the lift-off method illustrated in FIG. 23. In FIGS. 23, 24, and 25, those parts that are identical to those according to the second embodiment are denoted by identical reference signs, and will be omitted from description.

As illustrated in FIG. 23, the lift-off method according to the third embodiment is similar to the lift-off method according to the second embodiment except that the optical device layer transferring step 103 includes the placing step 1031 and a pulling step 1038.

In the placing step 1031 of the optical device layer transferring step 103 of the lift-off method according to the third embodiment, as with the second embodiment, the reverse side 12, whose central portion is curved so as to project downwardly, of the transfer substrate 10 of the composite substrate 20 is caused to face the holding surface 52 of the holding table 51 of the separating apparatus 50, and is then placed on the holding surface 52 that lies flat horizontally, as illustrated in FIG. 24.

The pulling step 1038 of the optical device layer transferring step 103 of the lift-off method according to the third embodiment is a step of, while the composite substrate 20 is being placed on the holding table 51 with the transfer substrate that is warped in a projecting manner facing the holding table 51, the epitaxy substrate 2 and the transfer substrate 10 of the composite substrate 20 are pulled away from each other, applying the bending moment 100 in the direction opposite the direction in which the composite substrate 20 is warped to the area of the transfer substrate 10 including the outer peripheral portion thereof.

According to the third embodiment, in the pulling step 1038, as illustrated in FIG. 25, the separating apparatus 50 holds the outer peripheral portion of the reverse side 12 of the transfer substrate 10 of the composite substrate 20 placed on the holding table 51 under suction on suction pads 571 of a downwardly pulling unit 57, and also holds the outer peripheral portion of the reverse side 22 of the epitaxy substrate 2 of the composite substrate 20 under suction on suction pads 581 of an upwardly pulling unit 58. Then, the separating apparatus 50 moves the pulling units 57 and 58 a predetermined distance away from each other, as illustrated in FIG. 25. Now, the bending moment 100 is applied to the outer peripheral portion of the transfer substrate 10. Since at least a portion of the buffer layer 4 has been broken in the buffer layer breaking step 102, the optical device layer 3 is separated from the epitaxy substrate 2 in the outer peripheral portion of the composite substrate 20.

In the pulling step 1038 of the optical device layer transferring step 103 of the lift-off method according to the third embodiment, as illustrated in FIG. the separating apparatus 50 continuously pulls the downwardly pulling unit 57 downwardly while pulling the upwardly pulling unit 58 upwardly. According to the present invention, however, the separating apparatus 50 may vertically move the downwardly pulling unit 57 while the upwardly pulling unit 58 is being fixed in position, or alternatively may vertically move the upwardly pulling unit 58 while the downwardly pulling unit 57 is being fixed in position.

Thereafter, the separating apparatus 50 carries out the pulling step 1038 for a predetermined period of time and determines whether the pulling step 1038 has been finished or not (step 104). If the separating apparatus has not carried out pulling step 1038 for the predetermined period of time and hence determines that the pulling step 1038 has not been finished (step 104: No), then the processing goes back to the pulling step 1038.

In the lift-off method according to the third embodiment, as described above, the pulling step 1038 is carried out for the predetermined period of time to continuously pull the upwardly pulling unit 58 upwardly and continuously pull the downwardly pulling unit 57 downwardly, thereby continuously applying the bending moment 100 to the area of the composite substrate 20 including the outer peripheral portion thereof while the area of the composite substrate 20 including the central portion thereof is being held on the holding table 51, the bending moment 100 being applied in the direction opposite the direction in which the composite substrate is warped. Repeatedly applying the bending moment 100 ruptures the buffer layer 4 of the composite substrate 20 throughout the entire surface of the buffer layer 4, allowing the optical device layer 3 to be transferred to the transfer substrate 10.

If the separating apparatus 50 has carried out the pulling step 1038 for the predetermined period of time and hence determines that the pulling step 1038 has been finished (step 104: Yes), then the epitaxy substrate 2 is separated from the transfer substrate 10, transferring the optical device layer 3 to the transfer substrate 10. According to the present invention, during the pulling step 1038, the separating apparatus 50 may capture an image of the epitaxy substrate 2 from above with a camera, and determine from the captured image whether the degree of spreading of a nitrogen gas produced when GaN is decomposed has reached a predetermined value or not, thereby determining whether the pulling step 1038 has been finished or not. If the separating apparatus 50 determines that the degree of spreading of a nitrogen gas has not reached the predetermined value, for example, then the pulling step 138 is carried out. If the separating apparatus 50 determines that the degree of spreading of a nitrogen gas has reached the predetermined value, for example, then the epitaxy substrate 2 is separated from the transfer substrate 10, transferring the optical device layer 3 to the transfer substrate 10.

In the lift-off method according to the third embodiment, the pulling step 1038 is carried out for the predetermined period of time to continuously apply the bending moment 100 in the direction opposite the direction in which the epitaxy substrate 2 is warped to the composite substrate 20. Consequently, even if the buffer layer 4 has not sufficiently been broken in the buffer layer breaking step 102, the epitaxy substrate 2 can smoothly be peeled off from the optical device layer 3, transferring the optical device layer 3 to the transfer substrate 10. As a result, the lift-off method according to the third embodiment is advantageous effect in that even if the buffer layer 4 has not sufficiently been broken, the epitaxy substrate 2 can smoothly be peeled off from the optical device layer 3.

According to the third embodiment, the composite substrate 20-1 may include the transfer substrate 10-1 that is larger in diameter than the optical device wafer 1, and the optical device layer transferring step 103 may include the fluid ejecting step 1034 or may include the epitaxy substrate holding step 1035.

According to the present invention, the holding surface 52 of the holding table 51 may hold the transfer substrate 10 under suction thereon or may not hold the transfer substrate 10 under suction thereon in the third embodiment.

[Modification]

A lift-off method according to a modification of the first embodiment, the second embodiment, and the third embodiment will be described below with reference to the drawings. FIG. 26 schematically illustrates, in side elevation, partly in cross section, an optical device layer transferring step of the lift-off method according to the modification of the first embodiment, the second embodiment, and the third embodiment. In FIG. 26, those parts that are identical to those according to the first, second, and third embodiments are denoted by identical reference signs, and will be omitted from description.

As illustrated in FIG. 26, in the lift-off method according to the modification of the first, second, and third embodiments, the holding surface 52 of the holding table 51 is curved in a direction opposite the direction in which the composite substrate 20 is warped. Specifically, the holding surface 52 of the holding table 51 is curved so as to project upwardly in its central area.

The lift-off method according to the modification of the first, second, and third embodiments is advantageous effect in that, as with the first, second, and third embodiments, even if the buffer layer 4 has not sufficiently been broken, the epitaxy substrate 2 can smoothly be peeled off from the optical device layer 3.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A lift-off method of transferring an optical device layer to a transfer substrate from an optical device wafer where the optical device layer has been disposed on a face side of an epitaxy substrate with a buffer layer interposed therebetween, the method comprising:

a transfer substrate joining step of joining the transfer substrate to a face side of the optical device layer of the optical device wafer with a joining member interposed therebetween, thereby making up a composite substrate which is warped;

a buffer layer breaking step of applying a pulsed laser beam having a wavelength transmittable through the epitaxy substrate and absorbable by the buffer layer, from a reverse side of the epitaxy substrate of the optical device wafer of the composite substrate, thereby breaking the buffer layer; and after the buffer layer breaking step, an optical device layer transferring step of peeling off the epitaxy substrate from the optical device layer and transferring the optical device layer to the transfer substrate, wherein the optical device layer transferring step includes a step of transferring the optical device layer to the transfer substrate by applying a bending moment in a direction opposite to a direction in which the composite substrate is warped to an area of the composite substrate that includes an outer peripheral portion thereof while holding an area of the composite substrate that includes a central portion thereof thereby reducing the warpage of the composite substrate.

2. The lift-off method according to claim 1, wherein the optical device layer transferring step includes a step of repeatedly applying the bending moment to the area of the composite substrate that includes the outer peripheral portion thereof.

3. The lift-off method according to claim 1 wherein the optical device layer transferring step includes the step of transferring the optical device layer to the transfer substrate by repeating an entire surface suction step of bringing the transfer substrate that is warped in a projecting manner into facing relation to the a holding table and attracting an entire surface of the composite substrate under suction to the holding table, thereby applying the bending moment in the direction opposite the direction in which the composite substrate is warped, to an area of the transfer substrate that includes its outer peripheral portion, and, after the entire surface suction step, an outer peripheral portion releasing step of releasing the area of the composite substrate that includes the outer peripheral portion thereof from being held under suction while continuously holding the area of the composite substrate that includes the central portion thereof under suction.

4. The lift-off method according to claim 1, wherein the optical device layer transferring step includes the step of transferring the optical device layer to the transfer substrate by repeating a depressing step of, while the composite substrate is being placed on the a holding table with the transfer substrate that is warped in a projecting manner facing the holding table, depressing the area of the composite substrate including the outer peripheral portion thereof from the epitaxy substrate side of the composite substrate, thereby applying the bending moment in the direction opposite the direction in which the composite substrate is warped, to the area of the transfer substrate including the outer peripheral portion thereof, and a depression canceling step of canceling the depression of the area of the composite substrate including the outer peripheral portion thereof that has been depressed in the depressing step.

5. The lift-off method according to claim 3, wherein the optical device layer transferring step further includes a fluid ejecting step of ejecting a fluid to the buffer layer that is disposed at a boundary between the epitaxy substrate and the transfer substrate of the composite substrate.

6. The lift-off method according to claim 3, wherein the optical device layer transferring step further includes an epitaxy substrate holding step of holding the epitaxy substrate side of the composite substrate under suction.

7. The lift-off method according to claim 1, wherein the step of transferring the optical device layer to the transfer substrate includes placing the transfer substrate on a horizontally flat holding surface.

8. The lift-off method according to claim 7, wherein the horizontally flat holding surface includes a ring-shaped elastic member which is compressed by the transfer substrate.

9. A lift-off method of transferring an optical device layer to a transfer substrate from an optical device wafer where the optical device layer has been disposed on a face side of an epitaxy substrate with a buffer layer interposed therebetween, the method comprising:

a transfer substrate joining step of joining the transfer substrate to a face side of the optical device layer of the optical device wafer with a joining member interposed therebetween, thereby making up a composite substrate;

a buffer layer breaking step of applying a pulsed laser beam having a wavelength transmittable through the epitaxy substrate and absorbable by the buffer layer, from a reverse side of the epitaxy substrate of the optical device wafer of the composite substrate, thereby breaking the buffer layer; and after the buffer layer breaking step, an optical device layer transferring step of peeling off the epitaxy substrate from the optical device layer and transferring the optical device layer to the transfer substrate, wherein the optical device layer transferring step includes a step of transferring the optical device layer to the transfer substrate by applying a bending moment to an area of the composite substrate that includes an outer peripheral portion thereof while holding an area of the composite substrate that includes a central portion thereof and by repeating:

an entire surface suction step of bringing the transfer substrate that is warped in a projecting manner into facing relation to a holding table and attracting an entire surface of the composite substrate under suction to the holding table, thereby applying the bending moment in a direction opposite a direction in which the composite substrate is warped, to an area of the transfer substrate that includes an outer peripheral portion of the transfer substrate, and, after the entire surface suction step, an outer peripheral portion releasing step of releasing the area of the composite substrate that includes the outer peripheral portion thereof from being held under suction while continuously holding the area of the composite substrate that includes the central portion thereof under suction.

10. A lift-off method of transferring an optical device layer to a transfer substrate from an optical device wafer where the optical device layer has been disposed on a face side of an epitaxy substrate with a buffer layer interposed therebetween, the method comprising:

a transfer substrate joining step of joining the transfer substrate to a face side of the optical device layer of the optical device wafer with a joining member interposed therebetween, thereby making up a composite substrate;

a buffer layer breaking step of applying a pulsed laser beam having a wavelength transmittable through the epitaxy substrate and absorbable by the buffer layer, from a reverse side of the epitaxy substrate of the optical device wafer of the composite substrate, thereby breaking the buffer layer; and after the buffer layer breaking step, an optical device layer transferring step of peeling off the epitaxy substrate from the optical device layer and transferring the optical device layer to the transfer substrate, wherein the optical device layer transferring step includes a step of transferring the optical device layer to the transfer substrate by applying a bending moment to an area of the composite substrate that includes an outer peripheral portion thereof while holding an area of the composite substrate that includes a central portion thereof and by repeating:

a depressing step of, while the composite substrate is being placed on a holding table with the transfer substrate that is warped in a projecting manner facing the holding table, depressing the area of the composite substrate including the outer peripheral portion thereof from the epitaxy substrate side of the composite substrate, thereby applying the bending moment in a direction opposite a direction in which the composite substrate is warped, to the area of the transfer substrate including the outer peripheral portion thereof, and a depression canceling step of canceling the depression of the area of the composite substrate including the outer peripheral portion thereof that has been depressed in the depressing step.

* * * * *